(12) United States Patent
Nakagawa

(10) Patent No.: US 8,189,152 B2
(45) Date of Patent: May 29, 2012

(54) PRODUCTION METHOD OF LIQUID CRYSTAL DISPLAY DEVICE AND LIQUID CRYSTAL DISPLAY DEVICE

(75) Inventor: Hidetoshi Nakagawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 423 days.

(21) Appl. No.: 12/596,737

(22) PCT Filed: Dec. 18, 2007

(86) PCT No.: PCT/JP2007/074316
§ 371 (c)(1),
(2), (4) Date: Oct. 20, 2009

(87) PCT Pub. No.: WO2008/136155
PCT Pub. Date: Nov. 13, 2008

(65) Prior Publication Data
US 2010/0118246 A1 May 13, 2010

(30) Foreign Application Priority Data
Apr. 20, 2007 (JP) .................. 2007-111823

(51) Int. Cl.
*G02F 1/1337* (2006.01)
(52) U.S. Cl. .................................... 349/129
(58) Field of Classification Search .......... 349/129–130, 349/141, 156
See application file for complete search history.

(56) References Cited

U.S. PATENT DOCUMENTS

| 5,786,879 A | 7/1998 | Kodera et al. | |
|---|---|---|---|
| 5,877,836 A * | 3/1999 | Miura et al. | 349/184 |
| 5,909,265 A | 6/1999 | Kim et al. | |
| 5,986,736 A * | 11/1999 | Kodera et al. | 349/134 |

(Continued)

FOREIGN PATENT DOCUMENTS

EP 0 994 378 A2 4/2000
(Continued)

OTHER PUBLICATIONS

EP Supplementary Search Report mailed Jan. 14, 2011 in EP application 07850802.5.
(Continued)

*Primary Examiner* — James Dudek
(74) *Attorney, Agent, or Firm* — Nixon & Vanderhye, P.C.

(57) ABSTRACT

The present invention provides a liquid crystal display device and a production method of a liquid crystal display device, capable of improving display qualities in a display region close to a frame region without causing any defects. The present invention is a production method of a liquid crystal display device,
the liquid crystal display device including:
a pair of substrates facing each other;
a liquid crystal layer arranged between the pair of substrates;
an alignment film arranged on a liquid crystal layer-side surface of at least one of the pair of substrates; and
a pixel including two or more domains,
the production method including an exposure step of exposing the alignment film using a photomask having a first mask part and a second mask part,
the first mask part having a plurality of transmissive parts formed within a light-shielding region,
the second mask part having a plurality of transmissive parts formed within the light-shielding region in a form different from a form of the plurality of transmissive parts in the first mask part,
wherein the alignment film in a display region is exposed through the first mask part, and
the alignment film in a frame region is exposed through the second mask part.

11 Claims, 16 Drawing Sheets

U.S. PATENT DOCUMENTS

| | | |
|---|---|---|
| 6,191,836 B1 | 2/2001 | Woo et al. |
| 6,417,905 B1 | 7/2002 | Woo et al. |
| 6,462,797 B1 | 10/2002 | Woo et al. |
| 6,714,271 B1 | 3/2004 | Matsuyama et al. |
| 6,975,377 B2 | 12/2005 | Hsu et al. |
| 7,751,007 B2 * | 7/2010 | Morimoto et al. ............ 349/123 |
| 2002/0030165 A1 | 3/2002 | Suzuki |
| 2002/0171795 A1 | 11/2002 | Woo et al. |
| 2009/0284703 A1 | 11/2009 | Shoraku et al. |

FOREIGN PATENT DOCUMENTS

| | | |
|---|---|---|
| JP | 10-104630 | 4/1998 |
| JP | 10-142608 | 5/1998 |
| JP | 2000-122302 | 4/2000 |
| JP | 2000-275646 | 10/2000 |
| JP | 2001-249352 A | 9/2001 |
| JP | 2002-31804 | 1/2002 |
| JP | 2004-163857 | 6/2004 |
| JP | 2005-024649 | 1/2005 |
| JP | 2006-330503 | 12/2006 |

OTHER PUBLICATIONS

International Search Report for PCT/JP2007/074316, mailed Feb. 5, 2008.

* cited by examiner (a)

(b)

(a)

(b)

PRODUCTION METHOD OF LIQUID CRYSTAL DISPLAY DEVICE AND LIQUID CRYSTAL DISPLAY DEVICE

This application is the U.S. national phase of International Application No. PCT/JP2007/074316 filed 18 Dec. 2007, which designated the U.S. and claims priority to JP Application No. 2007-111823 filed 20 Apr. 2007, the entire contents of each of which are hereby incorporated by reference.

TECHNICAL FIELD

The present invention relates to a production method of a liquid crystal display device, and to a liquid crystal display device. More particularly, the present invention relates to an active matrix liquid crystal display device having excellent display qualities, and to a production method thereof.

BACKGROUND ART

A liquid crystal display device is now being widely used in a TV, a monitor for personal computers, and the like, because it is a display device with low electrical power consumption and it can be reduced in weight and thickness. The liquid crystal display device is not a self-emitting display device and it displays images using light from a backlight. An amount of the light from the back light is adjusted by electrically controlling alignment of liquid crystal molecules arranged between a pair of substrates (an active matrix substrate and a color filter substrate). Such a liquid crystal display device is commonly disadvantageous in viewing angle characteristics, and, so its characteristics need to be improved.

In order to improve the viewing angle characteristics of the liquid crystal display device, an alignment division technology in which one pixel is divided into two or more regions different in a tilt direction of liquid crystal molecules is now being researched and developed. According to this technology, the viewing angle characteristics can be improved by tilting the liquid crystal molecules in each pixel in different directions by voltage application to a liquid crystal layer. The respective regions which differ in the alignment (tilt) direction of the liquid crystal molecules are also called domain. The alignment division is also called multi-domain.

As the multi-domain liquid crystal display devices, examples of horizontal alignment liquid crystal display devices include: a multi-domain TN (twist nematic) liquid crystal display device; a multi-domain ECB (electrically controlled birefringence) liquid crystal display device; and a multi-domain OCB (optically compensated birefringence) liquid crystal display device. In addition, examples of vertical alignment liquid crystal display devices include: a MVA (multi-domain vertical alignment) liquid crystal display device; a PVA (patterned vertical alignment) liquid crystal display device; a multi-domain VAECB (vertical alignment electrically controlled birefringence) liquid crystal display device; a multi-domain VAHAN (vertical alignment hybrid-aligned nematic) liquid crystal display device; and a multi-domain VATN (vertical alignment twisted nematic) liquid crystal display device. These various liquid crystal display devices are now being further developed in order to show improved viewing angle characteristics.

A rubbing method, a photo-alignment method, and the like, are mentioned as a method for the alignment division. In the rubbing method, for example, an alignment film is rubbed, with a rubbing region and a non-rubbing region being separated from each other by a resist pattern. According to such a rubbing method, the alignment film surface is provided with the alignment treatment by being rubbed with a cloth wound on a roller. In this method, dust such as a fiber of the cloth and rubbed scrapes are generated, and further, static electricity generated due to the fiber of the cloth might cause defects such as malfunction, a change in characteristics, and deterioration, of switching elements.

In the photo-alignment method, a photo-alignment film is used as a material for the alignment film, and the photo-alignment film is exposed to light such as ultraviolet light, and thereby the alignment film is provided with an alignment regulating force and/or an alignment regulating direction of the alignment film is changed. Thus, in the photo-alignment method, the alignment film can be subjected to the alignment treatment in a contact-less manner. Therefore, soils, dusts, and the like, which are generated by the alignment treatment, can be reduced. In addition, in the photo-alignment method, by exposing the alignment film through a pattern photomask including transmissive parts formed in a desired pattern, desired regions in the alignment film plane can be photo-irradiated under various conditions. As a result, domains having a desirable design can be easily formed.

The following technologies are disclosed as the photo-alignment method. Patent Document 1 discloses that an opening is formed along a boundary between domains, for example. Further, for example, Patent Document 2 discloses that at a boundary between domains, a region where liquid crystal molecules are aligned differently from those in the domains is arranged.

According to a common liquid crystal display device, a light-shielding layer for shielding light from a backlight is arranged in a frame region (non-display region), which is positioned surrounding a display region where images (moving images) are displayed. A resin black matrix (BM), which is formed in a color filter substrate, is generally used as the light-shielding layer.

Lately, in order for the liquid crystal display device to show a higher response speed, a distance between substrates (cell thickness) is decreased. So the BM is also formed to have a very small thickness. As a result, a transmittance of light that passes through the BM is increased, which causes light leakage from the frame region. This light leakage might have adverse effects on images displayed in the display region. Accordingly, in the conventional liquid crystal display device, display qualities in the display region close to the frame region need to be further improved.

In order to improve display qualities in the display region close to the frame region, the following technology is disclosed. For example, Patent Document 3 discloses that light leakage from an edge of a display region is suppressed by arranging a light shield device between drawing wirings (outgoing lines) formed in a frame region. If the light shield device is arranged to cover adjacent two drawing wirings and if one of the adjacent two drawing wings and the light shield device are leaked because of a film formation defect of an interlayer insulating film that is formed between the drawing wirings and the light shield device, the light shield device covers the other drawing wiring into which a different signal is fed. As a result, the adjacent two drawing wirings are influenced by each other's signals. If a film formation defect between one of adjacent two drawing wirings and the light shield device and a film formation defect between the other drawing wiring and the light shield device are generated, the two drawing wirings are leaked through the light shield. So the drawing wirings and the light shield device need to be arranged with a distance therebetween. However, if the distance between the drawing wiring and the light shield device is large, the light shield device can not sufficiently shield light from the backlight, and so light leakage deteriorates display qualities. If the distance between the drawing wiring and the light shield device is small and if a residual metal film after the drawing wiring is formed is electrically connected to adjacent two drawing wirings, this electrical connection might not be corrected because the correction might cause some defects, for example, in the following case: if this residual metal film is removed by laser to cut the electrical correction, the light shield device might be also welded.

[Patent Document 1]
  Japanese Kokai Publication No. 2000-257646
[Patent Document 2]
  Japanese Kokai Publication No. 2002-31804
[Patent Document 3]
  U.S. Pat. No. 6,975,377

DISCLOSURE OF INVENTION

The present invention has been made in view of the above-mentioned state of the art. The present invention has an object to provide a production method of a liquid crystal display device and a liquid crystal display device, each capable of improving display qualities in the display region close to the frame region without causing any defects.

The present inventors made various investigations on a production method of a liquid crystal display device and a liquid crystal display device, each capable of improving display qualities in the display region close to the frame region without causing any defects. The present inventors noted a dark line that appears between domains, when the photo-alignment method is employed for the alignment division. Then, the inventors found that, in conventional technologies, an alignment film in the display region and the frame region is exposed through a photomask where transmissive parts are formed in a uniform pattern, and so a dark line appearing between the domains in the display region and a dark line appearing between the domains in the frame region are the same in form such as planar shape and pitch. Further, the inventors found that using a photomask having: a first mask part where transmissive parts are formed in a pattern suitable for forming domains in the display region; and a second mask part where transmissive parts are formed in a pattern different from that of the transmissive parts in the mask part, the alignment film in the display region is exposed through the first mask part and the alignment film in the frame region is exposed through the second mask part, and thereby in the display region, a desirable form of domains (arrangement forms of domains and a dark line that appears between the domains) is adjusted, and in the frame region, the number and/or area of the dark line appearing between domains can be different from or more preferably larger than that/those of the conventional dark line. As a result, the light leakage in the vicinity of the frame region can be suppressed. Thus, the above-mentioned problems have been admirably solved, leading to completion of the present invention.

That is, the present invention is a production method of a liquid crystal display device,
  the liquid crystal display device including:
  a pair of substrates facing each other;
  a liquid crystal layer arranged between the pair of substrates;
  an alignment film arranged on a liquid crystal layer-side surface of at least one of the pair of substrates; and
  a pixel including two or more domains,
  the production method comprising an exposure step of exposing the alignment film using a photomask having a first mask part and a second mask part,
  the first mask part having a plurality of transmissive parts formed within a light-shielding region,
  the second mask part having a plurality of transmissive parts formed within the light-shielding region in a form different from a form of the plurality of transmissive parts in the first mask part,
  wherein the alignment film in a display region is exposed through the first mask part, and
  the alignment film in a frame region is exposed through the second mask part. As a result, in the display region, the arrangement forms of the domains and the dark line appearing between the domains are appropriately determined for desired display characteristics, and in the frame region, at least one of the number and the area of the dark line appearing between the domains can be different from that of the conventional dark line. That is, a dark line that can suppress light leakage from the frame region can appear in the frame region. In addition, the pattern of the transmissive parts in the second mask part through which the alignment film in the frame region is exposed is just adjusted so that a dark line having a desired form appears in the frame region, and so any particular defects are not caused in the production method, of the liquid crystal display device of the present invention. As a result, a liquid crystal display device capable of improving display qualities in the display region close to the frame region without causing any defects can be produced. The production method of the liquid crystal display device of the present invention is mentioned in more detail below.

The above-mentioned alignment film is a photo-alignment film, and exposure is employed for providing such a photo-alignment film with alignment treatment. The alignment film is generally formed of a material (photo-alignment material) that can align liquid crystal molecules in directions different depending on a photo-irradiation direction or a moving direction of a photo-irradiation region.

The above-mentioned domains are a plurality of regions different in tilt direction of liquid crystal molecules included in the liquid crystal layer and the tilt direction varies depending on a voltage applied to the liquid crystal layer.

The first mask part is generally arranged to overlap with at least the display region. The first mask part may be arranged to overlap with the display region and a part of the frame region. That is, the alignment film in the display region and a part of the frame region may be exposed through the first mask part. The second mask part is generally arranged to overlap with the frame region.

According to the production method of the liquid crystal display device of the present invention, the form is at least one of a size, a planar shape, an array direction, and an arrangement (distribution). The arrangement also means a pitch or a cycle. The pitch used herein generally means a distance between two corresponding points of adjacent two objects (members). The pitch of the transmissive parts used herein means a distance between two corresponding points of adjacent two transmissive parts.

In addition, if a pitch of the transmissive parts in the first mask part is different from a pitch of the transmissive parts in the second mask part, it is preferable that the production method includes an exposure step of exposing the alignment film using a photomask having a first mask part and a second mask part, the first mask part having a plurality of transmissive parts formed within a light-shielding region at a constant pitch, the second mask part having a plurality of transmissive parts formed within the light-shielding region at a pitch different from the constant pitch, the alignment film in the display region is exposed through the first mask part, and the alignment film in the frame region is exposed through the second mask part.

The production method of the liquid crystal display device of the present invention may or may not include other steps as long as it includes the above-mentioned exposure step.

The liquid crystal display device produced by the present invention includes: a pair of substrates facing each other; a liquid crystal layer arranged between the pair of substrates; an alignment film arranged on a liquid crystal layer side-surface of at least one of the pair of substrates; and a pixel including two or more domains. The liquid crystal display device produced by the production method of the present invention may or may not include other components as long as it essentially includes common components a multi-domain matrix liquid crystal display device has.

The liquid crystal display device produced by the production method of the present invention is preferably an active matrix liquid crystal display device, but it may be a passive matrix liquid crystal display device.

Preferred embodiments of the production method of the liquid crystal display device of the present invention are mentioned below in more detail. Various embodiments mentioned below may be appropriately employed in combination.

It is preferable that the alignment film is arranged on liquid crystal layer side-surfaces of both of the pair of substrates in order to improve display qualities and responsivity of the liquid crystal display device.

In order to more exhibit the advantages of the present invention, it is preferable that each substrate including the alignment film on its liquid crystal layer side-surface is subjected to the above-mentioned exposure step.

It is preferable in the above-mentioned exposure step that the first mask part is a mask part,
the second mask part is a mask fine part, and
the plurality of transmissive parts in the mask fine part are finer than the plurality of transmissive parts in the mask part (hereinafter, also referred to as "a first embodiment"). According to the first embodiment, in the display region, the arrangement forms of the domains and the dark line appearing between the domains are adjusted for desired display characteristics, and in the frame region, at least one of the number and the area of the dark line appearing between domains can be larger than that of the conventional dark line. As a result, the leakage from the frame region can be easily and effectively suppressed. The pattern of the transmissive parts in the mask fine part through which the alignment film in the frame region is exposed is just adjusted so that the number of the dark lines in the frame region is increased, and so any particular defects are not caused in this embodiment, either.

The transmissive parts in the mask frame part are finer than those in the mask part, as mentioned above. More specifically, it is preferable that at least one of the size and pitch of the transmissive parts in the mask fine part is smaller than that of the transmissive parts in the mask part. It is more preferable that both of the size and pitch of the transmissive parts in the mask fine part are smaller than those of the transmissive parts in the mask part.

According to the first embodiment, the planar shape of the plurality of transmissive parts in the mask part (the first mask part) is not especially limited. In order to provide pixels with alignment division efficiently and form the transmissive parts in the mask part with accuracy, it is preferable that the planar shape is substantially the same among the plurality of transmissive parts, and it is more preferable that the planar shape is a substantially rectangular shape.

The term "substantially the same" used herein does not always means "perfectly the same" and it means "the same" to such an extent that the advantages of the present invention are exhibited.

According to the first embodiment, the planar shape of the plurality of transmissive parts in the mask fine part (the second mask part) is not especially limited, and it may be appropriately determined in accordance with a desired shape of the dark line.

According to the first embodiment, the arrangement form of the plurality of transmissive parts in the mask part is not especially limited. In order to efficiently provide pixels arrayed in a matrix pattern with alignment division and to reduce production costs of the photomask, it is preferable that the plurality of transmissive parts in the mask part are formed in a repeated pattern within the light-shielding region. It is more preferable that the plurality of transmissive parts in the mask part have substantially the same planar shape and are formed at a substantially constant pitch within the light-shielding region in a repeated pattern. It is still more preferable that the plurality of transmissive parts in the mask part have a substantially rectangular shape as viewed in plane and are formed at a substantially constant pitch within the light-shielding region in a repeated pattern. From the same viewpoints, it is preferable that the mask part has the repeated pattern from one end to the other of a region that overlaps with at least the display region. Thus, it is preferable that the plurality of transmissive parts in the mask part are what is so-called slits and formed in what is so-called a stripe pattern. That is, it is preferable that in the mask part, a plurality of slits are formed in a stripe pattern within the light-shielding region, and it is more preferable that in the mask part, a plurality of slits having substantially the same planar shape are formed within the light-shielding region at a substantially constant pitch in a stripe pattern, and it is still more preferable that in the mask part, a plurality of slits having a substantially rectangular shape as viewed in plane are formed within the light-shielding region at a substantially constant pitch in a stripe pattern. Further, it is preferable that the mask part has the stripe pattern from one end to the other of a region that overlaps with at least the display region. The repeated pattern in the mask part is not especially limited to the stripe pattern, and may be a dot pattern, for example.

The term "substantially constant" used herein does not always means "perfectly constant" and it means "constant" to such an extent that the advantages of the present invention are exhibited.

According to the first embodiment, the arrangement form of the plurality of transmissive parts in the mask fine part is not especially limited. In order to form the transmissive parts in the mask fine part with accuracy and to perform the production method of the liquid crystal display device of the present invention more easily by easier design of the transmissive parts in the mask part and the mask fine part, it is preferable that the plurality of light-shielding parts in the mask fine part are formed in a repeated pattern within the light-shielding region. It is more preferable that the plurality of light-shielding parts in the mask fine parts have substantially the same planar shape and are formed at a substantially constant pitch within the light-shielding region in a repeated pattern. The repeated pattern in the mask fine part is not especially limited, and it is preferably a stripe pattern or a dot pattern. Thus, it is preferable that the plurality of transmissive parts in the mask fine part are what is so-called slits and formed in what is so-called a stripe pattern. Alternatively, it is preferable that the plurality of transmissive parts in the mask fine part are what is so-called dots and formed in what is so-called a lattice pattern. That is, it is preferable that in the mask fine part, a plurality of slits are formed in a stripe pattern within the light-shielding region, and it is more preferable that in the mask fine part, a plurality of slits having substantially the same planar shape are formed within the light-shielding region at a substantially constant pitch in a stripe pattern. Further, it is preferable that in the mask fine part, a plurality of dots are formed in a lattice pattern within the light-shielding region, and it is more preferable that in the mask fine part, a plurality of dots having substantially the same planar shape are formed within the light-shielding region at a substantially constant pitch in a lattice pattern.

From such a viewpoint, according to the first embodiment, it is preferable that the production method includes an exposure step of exposing the alignment film using the photomask having the mask part and the mask fine part, the mask part having a plurality of light-shielding parts formed within the light-shielding region at a substantially constant pitch in a repeated pattern, the mask fine part having a plurality of transmissive parts formed within the light-shielding region at a substantially constant pitch in a repeated pattern, the constant pitch of the transmissive parts in the mask fine part is smaller than the constant pitch of the transmissive parts in the mask part (and more preferably, the transmissive parts in the mask fine part are smaller than those in the mask part), wherein the alignment film in the display region is exposed through the mask part and the alignment film in the frame region is exposed through the mask fine part. It is also preferable that the plurality of transmissive parts in the mask part and the mask fine part are a plurality of slits, respectively, the plurality of slits are formed parallel to one another in a stripe pattern, the plurality of slits in the mask part are formed at a constant (substantially constant) pitch, the plurality of slits in the mask fine part are formed at a pitch smaller than the constant pitch, and the plurality of slits in the mask fine part have a width smaller than a width of the plurality of slits in the mask part.

The above term "constant (substantially constant)" does not always means "perfectly constant" and it means "constant" to such an extent that the advantages of the present invention are exhibited.

The term "parallel" used herein does not always means "perfectly parallel" and it means "parallel" to such an extent that the advantages of the present invention are exhibited.

It is preferable in the above-mentioned exposure step that the plurality of transmissive parts in the first and second mask parts are a plurality of slits, respectively, the first mask part is a mask part, the second mask part is a mask frame part, the plurality of slits in the mask part are formed parallel to one another at a constant pitch in a stripe pattern, the plurality of slits in the mask frame part are formed at a constant pitch in a stripe pattern, and an array direction of the plurality of slits is different between the mask part and the mask frame part (hereinafter, also referred to as "a second embodiment"). According to the second embodiment, pixels arrayed in a matrix pattern are efficiently provided with alignment division and production costs of the photomask are reduced, and in the frame region, at least one of the number and the area of the dark line appearing between the domains can be larger than that of the conventional dark line. As a result, the leakage from the frame region can be easily and effectively suppressed. The pattern of the transmissive parts in the mask frame part through which the alignment in the frame region is exposed is just adjusted so that the number of the dark lines in the frame region is increased, and so any particular defects are not caused in this embodiment, either.

The above term "constant" does not always means "perfectly constant" and it means "substantially constant" to such an extent that the advantages of the present invention are exhibited.

According to the second embodiment, the planar shape of the plurality of slits in the mask part is not especially limited. In order to provide pixels with alignment division efficiently and form the slits in the mask part with accuracy, it is preferable that the planar shape is substantially the same among the plurality of slits in the mask part, and it is more preferable that the planar shape is a substantially rectangular shape. From the same viewpoint, it is preferable that the mask part has a stripe pattern from one end to the other of a region that overlaps with at least the display region.

According to the second embodiment, the planar shape of the plurality of slits in the mask frame part is not especially limited, and it may be appropriately determined in accordance with a desired shape of the dark line. In order to form the slits in the mask frame part with accuracy and to perform the production method of the liquid crystal display device of the present invention more easily by easier design of the transmissive parts in the mask part and the mask fine part, it is preferable that the planar shape is substantially the same among the plurality of slits in the mask frame part, and it is more preferable that the planar shape is a substantially rectangular shape. From the same viewpoint, it is preferable that the mask frame part has a stripe pattern from one end to the other of a region that overlaps with at least the display region.

Preferable embodiments of the mask frame part in the second embodiment are mentioned below. According to the second embodiment, it is preferable that the array direction of the plurality of slits in the mask frame part is perpendicular to the array direction of the plurality of slits in the mask part, and it is also preferable that the array direction of the plurality of slits in the mask frame part is oblique to the array direction of the plurality of slits in the mask part, and a pitch of the plurality of slits in the mask part and a pitch of the plurality of the slits in the mask frame part are the same in the same direction.

It is preferable that the first mask part is a mask part, and the second mask part is a mask frame part, and the plurality of transmissive parts in the mask frame part are formed in a pattern different from a pattern of the plurality of transmissive parts in the mask part (hereinafter, also referred to as "a third embodiment"). According to the third embodiment, in the frame region, at least one of the number and the area of the dark line appearing between the domains can be larger than that of the conventional dark line. As a result, the leakage from the frame region can be easily and effectively suppressed. The pattern of the transmissive parts in the mask frame part through which the alignment in the frame region is exposed is just adjusted so that the number of the dark lines in the frame region is increased, and so any particular defects are not caused in this embodiment, either.

According to the third embodiment, the planar shape of the plurality of transmissive parts in the mask part is not especially limited. In order to provide pixels with alignment division efficiently and form the slits in the mask part with accuracy, it is preferable that the planar shape is substantially the same among the plurality of transmissive parts in the mask part, and it is more preferable that the planar shape is a substantially rectangular shape.

According to the third embodiment, the planar shape of the plurality of transmissive parts in the mask fine part is not especially limited, and it may be appropriately determined in accordance with a desired shape of the dark line.

According to the third embodiment, the arrangement form of the plurality of transmissive parts in the mask part is not especially limited. In order to efficiently provide pixels arrayed in a matrix pattern with alignment division and to reduce production costs of the photomask, it is preferable that a plurality of light-shielding parts in the mask part are formed in a repeated pattern within the light-shielding region. It is more preferable that the plurality of light-shielding pars in the mask part have substantially the same planar shape and are formed at a substantially constant pitch within the light-shielding region in a repeated pattern. It is still more preferable that the plurality of light-shielding parts in the mask part have a substantially rectangular shape as viewed in plane and are formed at a substantially constant pitch within the light-shielding region in a stripe pattern. From the same viewpoint, it is preferable that the mask part has the repeated pattern from one end to the other of a region that overlaps with at least the display region. Thus, it is preferable that the plurality of transmissive parts in the mask part are what is so-called slits and formed in what is so-called a stripe pattern. That is, it is preferable that in the mask part, a plurality of slits are formed in a stripe pattern within the light-shielding region, and it is more preferable that in the mask part, a plurality of slits having substantially the same planar shape are formed within the light-shielding region at a substantially constant pitch in a stripe pattern, and it is still more preferable that in the mask part, a plurality of slits having a substantially rectangular shape as viewed in plane are formed within the light-shielding region at a substantially constant pitch in a stripe pattern. Further, it is preferable that the mask part has the stripe pattern from one end to the other of a region that overlaps with at least the display region. The repeated pattern in the mask part is not especially limited to the stripe pattern, and may be a dot pattern, for example.

According to the third embodiment, the arrangement form of the plurality of transmissive parts in the mask frame part is not especially limited. In order to form the transmissive parts in the mask frame part with accuracy and to perform the production method of the liquid crystal display device of the present invention more easily by easier design of the transmissive parts in the mask part and, the mask fine part, it is preferable that a plurality of light-shielding parts in the mask frame part are formed in a repeated pattern within the light-shielding region. It is more preferable that the plurality of light-shielding parts have substantially the same planar shape and are formed at a substantially constant pitch within the light-shielding region in a repeated pattern. The repeated pattern in the mask frame part is not especially limited as long as it is different from the pattern in the mask part. A dot pattern is preferable as the repeated pattern in the mask frame part. Thus, it is preferable that the plurality of transmissive parts in the mask frame are what is so-called dots and formed in what is so-called a lattice pattern. That is, it is preferable that in the mask frame part, a plurality of dots are formed in a lattice pattern within the light-shielding region, and it is more preferable that in the mask frame part, a plurality of dots having substantially the same planar shape are formed within the light-shielding region at a substantially constant pitch in a lattice pattern.

According to the third embodiment, it is preferable that the plurality of transmissive parts in the mask part are a plurality of slits, the plurality of transmissive parts in the mask frame part are a plurality of dots, the plurality of slits in the mask part are formed parallel to one another at a constant pitch in a stripe pattern, and the plurality of dots in the mask frame part are formed at a constant pitch in a lattice pattern. According to this embodiment, pixels arrayed in a matrix pattern are efficiently provided with alignment division and production costs of the photomask are reduced, and in the frame region, at least one of the number and the area of the dark line appearing between the domains can be larger than that of the conventional dark line.

It is preferable that the exposure step is performed by scanning exposure or shot exposure. That is, it is preferable in the exposure step that the alignment film is exposed by moving at least one of the substrate and a light source (scanning exposure) or that the alignment film is exposed with the substrate and a light source being fixed (shot exposure). According to the scanning exposure, a stable amount of light is radiated to the substrate plane and so a variation in characteristics of the alignment film such as an alignment direction and a pretilt angle can be effectively suppressed. Further, a small exposure apparatus is enough for the scanning exposure and so apparatus costs can be reduced. In addition, even if the photomask has a defect or it is damaged, costs on replacement of the photomask are low. In the scanning exposure, if another panel that is different in pitch of the transmissive parts is arranged in the scanning direction, the photomask needs to be replaced with another one suitable for the panel. In contrast, according to the shot exposure, various kinds of panels can be exposed in one shot using a photomask including patterns for the various kinds of panels. In the scanning exposure, if the light source is moved, the light source and the photomask are generally moved together.

In the above-mentioned exposure step, it is preferable that the alignment film is exposed to ultraviolet light from a direction oblique to a normal direction of a surface of the at least one of the pair of substrates, although depending on a material for the alignment film to be exposed. As a result, even if a common alignment film is used, the liquid crystal molecules in the liquid crystal layer can be easily provided with a pretilt angle suitable in respective display modes, and thereby a response speed of the liquid crystal molecules can be improved.

It is preferable that the ultraviolet light is polarized ultraviolet light. Thus, the alignment film is exposed to UV light, which shows anisotropy, and thereby anisotropic rearrangement or chemical reaction of molecules constituting the alignment film can be easily induced. Accordingly, the alignment direction of the liquid molecules near the alignment film can be more uniformly controlled. The wavelength range of the UV light may be appropriately determined depending on a material for the alignment film to be exposed.

It is preferable that the liquid crystal display device includes a plurality of the pixels, in the exposure step, the alignment film is exposed so that each pixel includes two regions different in an alignment direction of liquid crystal molecules near a surface of the alignment film when the pair of substrates are viewed in plane, and the alignment direction in one region is parallel and opposite to the alignment direction in the other region. In this case, wide viewing angle liquid crystal display devices such as a multi-domain TN liquid crystal display device, a multi-domain ECB liquid crystal display device, a multi-domain VAECB (vertical alignment electrically controlled birefringence) liquid crystal display device, a multi-domain VAHAN (vertical alignment hybrid-aligned nematic) liquid crystal display device, and a multi-domain VATN (vertical alignment twisted nematic) liquid crystal display device can be easily produced. In the present description, the "near a surface of the alignment film" is preferably the alignment film surface.

It is preferable that the alignment film is arranged on each of the pair of substrates,
the production method includes:
exposure of the alignment films; and
attachment of the pair of substrates,
each performed so that
in each substrate, liquid crystal molecules near a surface of the alignment film in each pixel are aligned in two parallel and opposite directions when the pair of substrates are viewed in plane, and
an alignment direction of liquid crystal molecules near a surface of the alignment film on one of the pair of substrates is perpendicular to an alignment direction of liquid crystal molecules near a surface of the alignment film on the other substrate when the pair of substrates are viewed in plane. As a result, one pixel is divided into four domains, easily. Accordingly, the viewing angle can be increased in four directions perpendicular to each other, i.e., upper, lower, right, and left directions. The four domains are excellent in symmetric property and so viewing angle characteristics in the four directions can be the same. As a result, the liquid crystal display device shows display characteristics without viewing angle dependence.

The above term "perpendicular" does not always means "perfectly perpendicular" and it means "substantially perpendicular" to such an extent that the advantages of the present invention are exhibited. According to the above-mentioned embodiment, more specifically, it is preferable that the liquid crystal molecules on the alignment film surface of one substrate and those on the alignment film surface of the other substrate are aligned perpendicular to each other to such an extent that images can be displayed in VATN mode.

Further, it is preferable that the liquid crystal layer includes liquid crystal molecules with negative dielectric anisotropy, and the alignment film aligns the liquid crystal molecules nearly vertically to a surface of the alignment film when no voltage is applied to the liquid crystal layer (vertical alignment film). As a result, a VA liquid crystal display device can be produced.

The term "nearly vertically" used herein means "vertically" to such an extent that the advantages of the present invention are exhibited. Specifically, it is preferable that the liquid crystal molecules are aligned vertically to such an extent that images can be displayed in VATN mode. More specifically, it is preferable that the liquid crystal molecules are aligned so that an angle made by a long axis of the molecule and the normal direction of the alignment film surface is 0.1° to 5° (more preferably, 1° to 2°).

Alternatively, it is preferable that the liquid crystal layer includes liquid crystal molecules with positive dielectric anisotropy, and the alignment film aligns the liquid crystal molecules nearly horizontally to a surface of the alignment film when no voltage is applied to the liquid crystal layer (horizontal alignment film). As a result, a horizontal alignment liquid crystal display device can be produced.

The term "nearly horizontally" used herein means "horizontally" to such an extent that the advantages of the present invention are exhibited. Specifically, it is preferable that the liquid crystal molecules are aligned horizontally to such, an extent that images can be displayed in TN mode. More specifically, it is preferable that the liquid crystal molecules are aligned so that an angle made by a long axis of the molecule and the alignment film surface is 0.1° to 5° (more preferably, 1° to 2°).

The present invention is a liquid crystal display device produced by the production method of the liquid crystal display device of the present invention. According to the production method of the liquid crystal display device of the present invention, at least one of the number and the area of the dark line appearing between the domains in the frame region can be different from, more preferably larger than that of the conventional dark line. Accordingly, a liquid crystal display device where light leakage from the frame region is suppressed can be produced.

The present invention is also a liquid crystal display device including:
a pair of substrates facing each other;
a liquid crystal layer arranged between the pair of substrates;
an alignment film arranged on a liquid crystal layer-side surface of at least one of the pair of substrates; and
a pixel including two or more domains,
wherein the liquid crystal display device has a display region and a frame region,
when an image is displayed in an intermediate or higher gradation level on a display screen and the image is viewed in front,
in the display region, a plurality of first dark lines appear in a first direction between adjacent domains at a constant pitch, and
the frame region includes a region where a plurality of second dark lines appear in a direction parallel to the first direction at a pitch different from the constant pitch (hereinafter, also referred to as "a first liquid crystal display device of the present invention").

The first liquid crystal display device of the present invention is mentioned in more detail below.

The first liquid crystal display device of the present invention includes: a pair of substrates facing each other; a liquid crystal layer arranged between the pair of substrates; an alignment film arranged on a liquid crystal layer side-surface of at least one of the pair of substrates; and a pixel including two or more domains. Accordingly, the first liquid crystal display device of the present invention shows excellent viewing angle characteristics and it is preferably used as a multi-domain matrix liquid crystal display device.

The first liquid crystal display device of the present invention is preferably an active matrix liquid crystal display device, but it may be a passive matrix liquid crystal display device.

Thus, the first liquid crystal display device has a display region and a frame region,
when an image is displayed in an intermediate or higher gradation level on a display screen and the image is viewed in front,
in the display region, a plurality of first dark lines appear in a first direction between adjacent domains at a constant pitch, and
the frame region includes a region where a plurality of second dark lines appear in a direction parallel to the first direction at a pitch different from the constant pitch. As a result, the number of the dark line, i.e., an area of a dark region, appearing between the domains in the frame region, is different from (more preferably, larger than) that of the dark line in the display region, and light leakage from the frame region can be suppressed. Any particular defects are not caused by the change in form of the dark line appearing between the domains in the frame region. Thus, display qualities in the display region close to the frame region can be improved without causing any defects.

The term "dark line" used herein is a dark line that appears depending on an alignment state of the liquid crystal molecule, i.e., a disclination line, regardless of a gradation level of an image displayed. The dark line has a luminance smaller than a luminance in an intermediate or higher gradation level regardless of being shielded by a light-shielding member when an image is displayed in an intermediate or higher gradation level and is viewed in front (in the normal direction of the display screen).

The intermediate gradation level means any gradation levels except for the lowest gradation level (black) and the highest gradation level (white).

The intermediate or higher gradation level means gradation levels except for black (i.e., intermediate gradation levels and the highest gradation level), and preferably higher half of all gradation levels, and more preferably the highest gradation level (white).

The first liquid crystal display device of the present invention may or may not include other components as long as it essentially includes such components. The configuration of the first liquid crystal display device of the present invention is not especially limited. According to the first liquid crystal display device of the present invention, the dark line appearing between the adjacent domains (hereinafter, also referred to as "domain boundary dark line") in the display region may be light-shielded by a light-shielding member such as a BM and a metal wiring. In this case, the first liquid crystal display device may have the following embodiment.

The fist liquid crystal display device has a display region and a frame region, when an image is displayed in an intermediate or higher gradation level on a display screen and the image is viewed in front, in the display region, a plurality of first light-shielding members are arranged in a first direction between adjacent domains at a constant pitch, and the frame region includes a region where a plurality of dark lines appear in a direction parallel to the first direction at a pitch different from the constant pitch. Alternatively, the first liquid crystal display device may have the following embodiment.

The first liquid crystal display device has a display region and a frame region, when an image is displayed in an intermediate or higher gradation level on a display screen and the image is viewed in front, in the display region, a plurality of first light-shielding members are arranged to light-shield a plurality of first dark lines appearing between adjacent domains at a constant pitch in a first direction, and the frame region includes a region where a plurality of second dark lines appear in a direction parallel to the first direction at a pitch different from the constant pitch.

A method for producing the first liquid crystal display device of the present invention is not especially limited, but the above-mentioned production method of the liquid crystal display device of the present invention is preferable. The first liquid crystal display device of the present invention can be more easily produced by the above-mentioned production method. In this case, it is preferable that the first liquid crystal display device includes a photo-alignment film as the alignment film, and exposure is employed as an alignment treatment for such a photo-alignment film. In addition, it is preferable that the alignment film is formed of a material (photo-alignment material) that can align liquid crystal molecules in directions different depending on a photo-irradiation direction or a moving direction of a photo-irradiation region.

Preferable embodiments of the first liquid crystal display device of the present invention are mentioned below in more detail.

It is preferable that the pitch of the plurality of second dark lines is smaller than the constant pitch. As a result, the number of the dark line, i.e., an area of a dark region, appearing between the domains in the frame region, is larger than that of the dark line in the display region, and light leakage from the frame region can be effectively suppressed.

It is preferable that in the display region, a plurality of third dark lines further appear in a second direction between adjacent domains at a constant pitch, the second direction being perpendicular to the first direction, and in the region included in the frame region, a plurality of fourth dark lines further appear in a direction parallel to the second direction at a pitch smaller than the constant pitch of the plurality of third dark lines. Thus, the frame region has a region where the dark lines closely appear in two directions perpendicular to each other, and thereby, the number of the dark line appearing between the domains in the frame region, that is, the area of the dark region, is more increased, and light leakage from the frame region can be more suppressed.

It is preferable that the region where the dark lines closely appear in two directions perpendicular to each other is positioned at a corner (corners) of the frame region. According to this, this embodiment can be easily provided. That is, it is preferable that the liquid crystal display device has a display region and a frame region surrounding the display region, the display region having a square shape as viewed in plane, the frame region having a band shape as viewed in plane, in the display region, a plurality of third dark lines further appear in a second direction between adjacent domains at a constant pitch, the second direction being perpendicular to the first direction, in the region included in the frame region, a plurality of fourth dark lines further appear in a direction parallel to the second direction at a pitch smaller than the constant pitch of the plurality of third dark lines, and this region is positioned at a corner of the frame region.

The present invention is also a liquid crystal display device including:

a pair of substrates facing each other;

a liquid crystal layer arranged between the pair of substrates;

an alignment film arranged on a liquid crystal layer-side surface of at least one of the pair of substrates; and a pixel including two or more domains, wherein the liquid crystal display device has a display region and a frame region each having a plurality of domains, in the display region and the frame region, dark lines appear between adjacent domains when an image is displayed in an intermediate or higher gradation level on a display screen and the image is viewed in front, and an arrangement of the plurality of domains in the frame region is different from an arrangement of the plurality of domains in the display region (hereinafter, also referred to as "a second liquid crystal display device of the present invention).

The second liquid crystal display device of the present invention is mentioned in more detail below.

The second liquid crystal display device of the present invention includes: a pair of substrates facing each other; a liquid crystal layer arranged between the pair of substrates; an alignment film arranged on a liquid crystal layer side-surface of at least one of the pair of substrates; and a pixel including two or more domains. Accordingly, the second liquid crystal display device of the present invention shows excellent viewing angle characteristics and it is preferably used as a multi-domain matrix liquid crystal display device.

The second liquid crystal display device of the present invention is preferably an active matrix liquid crystal display device, but it may be a passive matrix liquid crystal display device.

Thus, the second liquid crystal display device has a display region and a frame region each having a plurality of domains, in the display region and the frame region, dark lines appear between adjacent domains when an image is displayed in an intermediate or higher gradation level on a display screen and the image is viewed in front, and an arrangement of the plurality of domains in the frame region is different from an arrangement of the plurality of domains in the display region. As a result, at least one of the number and the area of the dark line appearing between the domains in the frame region, is different from (more preferably, larger than) that of the dark line in the display region, and light leakage from the frame region can be suppressed. Any particular defects are not caused by the changing the arrangement form of the dark line appearing between the domains in the frame region. Thus, display qualities in the display region close to the frame region can be improved without causing any defects.

The second liquid crystal display device of the present invention may or may not include other components as long as it essentially includes such components. The configuration of the second liquid crystal display device of the present invention is not especially limited. According to the second liquid crystal display device of the present invention, the dark line appearing between the adjacent domains (domain boundary dark line) in the display region may be light-shielded by a light-shielding member such as a BM and a metal wiring, similarly to the first liquid crystal display device of the present invention.

A method for producing the second liquid crystal display device of the present invention is not especially limited, but the above-mentioned production method of the liquid crystal display device of the present invention is preferable. The second liquid crystal display device of the present invention can be more easily produced by the above-mentioned production method. In this case, it is preferable that the second liquid crystal display device includes a photo-alignment film as the alignment film, and exposure is employed as an alignment treatment for such a photo-alignment film. In addition, it is preferable that the alignment film is formed of a material (photo-alignment material) that can align liquid crystal molecules in directions different depending on a photo-irradiation direction or a moving direction of a photo-irradiation region.

The present invention is also a liquid crystal display device including:

a pair of substrates facing each other;

a liquid crystal layer arranged between the pair of substrates;

an alignment film arranged on a liquid crystal layer-side surface of at least one of the pair of substrates; and a pixel including two or more domains, wherein the liquid crystal display device has a display region and a frame region each having a plurality of domains, in the display region and the frame region, dark lines appear between adjacent domains when an image is displayed in an intermediate or higher gradation level on a display screen and the image is viewed in front, and a combination of the plurality of domains in the frame region is different from a combination of the plurality of domains in the display region (hereinafter, also referred to as "a third liquid crystal display device of the present invention"). The third liquid crystal display device is mentioned in more detail below.

The third liquid crystal display device of the present invention includes: a pair of substrates facing each other; a liquid crystal layer arranged between the pair of substrates; an alignment film arranged on a liquid crystal layer side-surface of at least one of the pair of substrates; and a pixel including two or more domains. Accordingly, the third liquid crystal display device of the present invention shows excellent viewing angle characteristics and it is preferably used as a multi-domain matrix liquid crystal display device.

The third liquid crystal display device of the present invention is preferably an active matrix liquid crystal display device, but it may be a passive matrix liquid crystal display device.

Thus, the third liquid crystal display device has a display region and a frame region each having a plurality of domains, in the display region and the frame region, dark lines appear between adjacent domains when an image is displayed in an intermediate or higher gradation level on a display screen and the image is viewed in front, and a combination of the plurality of domains in the frame region is different from a combination of the plurality of domains in the display region. As a result, at least one of the number and the area of the dark line appearing between the domains in the frame region, is different from (more preferably, larger than) that of the dark line in the display region, and light leakage from the frame region can be suppressed. Any particular defects are not caused by the change in arrangement form of the dark line appearing between the domains in the frame region. Thus, display qualities in the display region close to the frame region can be improved without causing any defects.

The third liquid crystal display device of the present invention may or may not include other components as long as it essentially includes such components. The configuration of the third liquid crystal display device of the present invention is not especially limited. According to the third liquid crystal display device of the present invention, the dark line appearing between the adjacent domains (domain boundary dark line) in the display region may be light-shielded by a light-shielding member such as a BM and a metal wiring, similarly to the first liquid crystal display device of the present invention.

A method for producing the third liquid crystal display device of the present invention is not especially limited, but the above-mentioned production method of the liquid crystal display device of the present invention is preferable. The third liquid crystal display device of the present invention can be more easily produced by the above-mentioned production method. In this case, it is preferable that the third liquid crystal display device includes a photo-alignment film as the alignment film, and exposure is employed as an alignment treatment for such a photo-alignment film. In addition, it is preferable that the alignment film is formed of a material (photo-alignment material) that can align liquid crystal molecules in directions different depending on a photo-irradiation direction or a moving direction of a photo-irradiation region.

The present invention is a liquid crystal display device including:

a pair of substrates facing each other;

a liquid crystal layer arranged between the pair of substrates;

an alignment film arranged on a liquid crystal layer-side surface of at least one of the pair of substrates; and a pixel including two or more domains, wherein the liquid crystal display device has a display region and a frame region each having a plurality of domains, in the display region and the frame region, dark lines appear between adjacent domains when an image is displayed in an intermediate or higher gradation level on a display screen and the image is viewed in front, and a shape of the plurality of domains in the frame region is different from a shape of the plurality of domains in the display region (hereinafter, also referred to as "a fourth liquid crystal display device of the present invention").

The fourth liquid crystal display device of the present invention is mentioned in more detail below.

The fourth liquid crystal display device of the present invention includes: a pair of substrates facing each other; a liquid crystal layer arranged between the pair of substrates; an alignment film arranged on a liquid crystal layer side-surface of at least one of the pair of substrates; and a pixel including two or more domains. Accordingly, the fourth liquid crystal display device of the present invention shows excellent viewing angle characteristics and it is preferably used as a multi-domain matrix liquid crystal display device.

The fourth liquid crystal display device of the present invention is preferably an active matrix liquid crystal display device, but it may be a passive matrix liquid crystal display device.

Thus, the fourth liquid crystal display device has a display region and a frame region each having a plurality of domains, in the display region and the frame region, dark lines appear between adjacent domains when an image is displayed in an intermediate or higher gradation level on a display screen and the image is viewed in front, and a shape of the plurality of domains in the frame region is different from a shape of the plurality of domains in the display region. As a result, the shape of the dark line appearing between the domains in the frame region can be appropriately determined so that light leakage from the frame region can be suppressed. Accordingly, light leakage from the frame region can be suppressed. Any particular defects are not caused by the change in form of the dark line appearing between the domains in the frame region. Thus, display qualities in the display region close to the frame region can be improved without causing any defects.

The fourth liquid crystal display device of the present invention may or may not include other components as long as it essentially includes such components. The configuration of the fourth liquid crystal display device of the present invention is not especially limited. According to the fourth liquid crystal display device of the present invention, the dark line appearing between the adjacent domains (domain boundary dark line) in the display region may be light-shielded by a light-shielding member such as a BM and a metal wiring, similarly to the first liquid crystal display device of the present invention.

A method for producing the fourth liquid crystal display device of the present invention is not especially limited, but the above-mentioned production method of the liquid crystal display device of the present invention is preferable. The fourth liquid crystal display device of the present invention can be more easily produced by the above-mentioned production method. In this case, it is preferable that the fourth liquid crystal display device includes a photo-alignment film as the alignment film, and exposure is employed as an alignment treatment for such a photo-alignment film. In addition, it is preferable that the alignment film is formed of a material (photo-alignment material) that can align liquid crystal molecules in directions different depending on a photo-irradiation direction or a moving direction of a photo-irradiation region.

In the first to fourth liquid crystal display devices, it is preferable that the pixel includes four or less domains, and it is more preferable that the pixel includes four domains. According to this, the production steps can be suppressed from being complicated, and further the first to fourth liquid crystal display devices can be excellent in viewing angle characteristics. If the pixel includes two domains, the viewing angle characteristics in one of the upper-lower direction and the right-left direction can be improved, but those in the other direction is difficult to improve. In contrast, if the pixel includes four domains, the viewing angle characteristics in four directions perpendicular to each other, i.e., upper, lower, right, and left directions, can be all improved. Additionally, the viewing angle characteristics in the four directions can be almost uniform, i.e., the viewing angle characteristics excellent in symmetric property can be produced. As a result, the first to fourth liquid crystal display devices show display characteristics free from viewing angle dependency. The pattern in which the four domains are arranged is not especially limited, and a matrix pattern, a horizontal-stripe pattern may be mentioned. One pixel region may include four or more domains, but it complicates production processes and increases the time for alignment treatment. Further, it has been known that the viewing angle characteristics are not so different practically between the four-domain alignment division and five or more-domain alignment division.

Further, it is preferable in the first to fourth liquid crystal display devices of the present invention that the liquid crystal layer includes liquid crystal molecules with negative dielectric anisotropy, the alignment film is arranged on each of the pair of substrates, and the alignment films align the liquid crystal molecules nearly vertically to surfaces of the alignment films when no voltage is applied to the liquid crystal layer (vertical alignment film). As a result, a vertical alignment liquid crystal display device can be produced.

It is preferable in the first to fourth liquid crystal display devices of the present invention that the liquid crystal layer includes liquid crystal molecules with positive dielectric anisotropy, the alignment film is arranged on each of the pair of substrates, and the alignment films align the liquid crystal molecules nearly horizontally to surfaces of the alignment films when no voltage is applied to the liquid crystal layer (horizontal alignment film). As a result, a horizontal alignment liquid crystal display device can be produced.

It is preferable in the first to fourth liquid crystal display devices of the present invention that an alignment direction of the liquid crystal molecules near a surface of the alignment film on one of the pair of substrates is perpendicular to an alignment direction of the liquid crystal molecules near a surface of the alignment film on the other substrate when the pair of substrates are viewed in plane. As a result, a multi-domain TN or multi-domain VATN liquid crystal display device can be produced. According to the VATN (vertical alignment twisted nematic) liquid crystal display device, liquid crystal molecules are vertically aligned and form a twist structure when no voltage is applied to a liquid crystal layer due to vertical alignment films that are arranged on substrates, respectively, so that their alignment treatment directions are substantially perpendicular to each other when the substrates are viewed in plane.

According to the above-mentioned embodiment, the term "perpendicular" preferably means "perpendicular" to such an extent that VATN display can be provided, more specifically.

Accordingly, the first to fourth liquid crystal display devices of the present invention may be appropriately combined. The embodiments mentioned in the first to fourth liquid crystal display devices of the present invention may be appropriately employed in combination.

EFFECT OF THE INVENTION

According to the production method of the liquid crystal display device of the present invention, the arrangement forms of the domains and the dark line appearing between the domains are appropriately determined for desired display characteristics in the display region, and in the frame region, at least one of the number and the area of the dark line appearing between the domains can be different from that of the conventional dark line. That is, the dark line capable of suppressing the light leakage from the frame region can appear in the frame region. In addition, the pattern of the transmissive parts in the second mask part through which the alignment in the frame region is exposed is just adjusted so that a dark line having a desired form appears in the frame region, and so any particular defects are not caused in the production method of the liquid crystal display device of the present invention. As a result, a liquid crystal display device capable of improving display qualities in the display region close to the frame region without causing any defects can be produced. According to the liquid crystal display device of the present invention, light leakage from the frame region can be suppressed without causing any defects. Thus, display qualities in the display region close to the frame region can be improved without causing any defects.

BEST MODES FOR CARRYING OUT THE INVENTION

The present invention is mentioned in more detail below with reference to Embodiments using drawings, but not limited to only these Embodiments.

Embodiment 1

FIG. 1 is a plan view schematically showing a liquid crystal display panel in accordance with Embodiment 1.

A liquid crystal display panel 100 in the present Embodiment has a display region (effective display area) 31 and a frame region 32 surrounding the display region 31 (non-display region, non-effective display area) in a substrate plane, as shown in FIG. 1. The display region 31 has a square shape and the frame region 32 has a band-shape, as viewed in plane. The display region 31 is a region where images are displayed and it is constituted by a plurality of pixels arrayed in a matrix pattern. The frame region 32 is a region which has no contribution to display and it is arranged around the display region. The display region 31 includes a light-shielding region that is arranged around and/or inside each pixel. The liquid crystal display panel 100 has, around the frame region 32, a terminal region (substrate extending part) 33 where a plurality of terminals through which a driving IC is connected to the panel 100 are arranged.

FIG. 2 is a cross-sectional view schematically showing a configuration of the display region in the liquid crystal display panel in accordance with Embodiment 1.

As shown in FIG. 2, the liquid crystal display panel 100 in the present Embodiment includes: a pair of substrates facing each other, i.e., a first substrate 1 (e.g., a TFT array substrate) and a second substrate 2 (e.g., a CF substrate); and a liquid crystal layer 3 interposed between the first substrate 1 and the second substrate 2. The first substrate 1 includes a transparent electrode 4a (pixel electrode) and a vertical alignment film 5a on a liquid crystal layer 3 side-surface of an insulating substrate 26a in this order toward the liquid crystal layer 3. The transparent electrode 4a applies a driving voltage to the liquid crystal layer 3. Similarly, the second substrate 2 includes a transparent electrode 4b (common electrode) and a vertical alignment film 5b on a liquid crystal layer 3 side-surface of an insulating substrate 26b in this order toward the liquid crystal layer 3. The transparent electrode 4b applies a driving voltage to the liquid crystal layer 3. A retarder 7a and a polarization plate 6a are arranged in this order on a surface on the side opposite to the liquid crystal layer 3 side of the first substrate 1. A retarder 7b and a polarization plate 6b are arranged in this order on a surface on the side opposite to the liquid crystal layer 3 side of the second substrate 2. The retarders 7a and 7b may not be arranged, but preferably arranged in view of wide viewing angle. Only one of the retarders 7a and 7b may be arranged.

The liquid crystal layer 3 includes a nematic liquid crystal material with negative dielectric anisotropy (negative fanatic liquid crystal material), for example. Liquid crystal molecules in the liquid crystal layer 3 are aligned substantially vertically to the surfaces of the vertical alignment films 5a and 5b when no driving voltage is applied to the liquid crystal layer 3 (during non-voltage application). In fact, the liquid crystal molecules are aligned to have a small pretilt angle of about 0.1° to several degrees with respect to the normal direction of the surfaces of the vertical alignment films 5a and 5b. That is, the vertical alignment films 5a and 5b provide the liquid crystal molecules with a small pretilt angle (preferably 85° or more and less than 90°). The term "pretilt angle" used herein means an angle made by a substrate surface and a long axis direction of a liquid crystal molecule 3b, which is positioned near the alignment film surfaces, when no voltage is applied. As the substrates are viewed in plane, a direction where the liquid crystal molecule 3b, which is positioned near the alignment film surfaces, is tilted when no voltage is applied is a pretilt direction. When a sufficient driving voltage not smaller than a certain threshold value is applied to the liquid crystal layer 3 (during voltage application), the liquid crystal molecules are further tilted in a direction in accordance with a predetermined pretilt angle. More specifically, the liquid crystal molecule 3a positioned at substantially the center in the thickness direction of the liquid crystal layer 3 is tilted substantially parallel to surfaces of the first substrate 1 and the second substrate 2. The vertical alignment films 5a and 5b are formed of a photo-alignment material. The pretilt directions which the vertical alignment films 5a and 5b regulate are determined by exposing surfaces of the vertical alignment films 5a and 5b through a photomask, for example, from a direction oblique to the substrate surface.

FIG. 3 is a plan view schematically showing a direction of photo-irradiation to the vertical alignment film in each picture element in the liquid crystal display panel in accordance with Embodiment 1. FIG. 3(a) shows the first substrate. FIG. 3(b) shows the second substrate. In FIG. 3, the dotted arrow shows a direction of photo-irradiation to the first substrate, and the solid arrow shows a direction of photo-irradiation to the second substrate. FIG. 4 is a plan view schematically showing: a direction of photo-irradiation to the vertical alignment film; an alignment direction of a liquid crystal molecule when a voltage is applied; and a direction of a polarization axis of a polarization plate, in each picture element in the liquid crystal display panel in accordance with Embodiment 1. In FIG. 4, the dotted arrow shows a direction of photo-irradiation to the first substrate and the solid arrow shows a direction of photo-irradiation to the second substrate. FIG. 4 shows a liquid crystal molecule that is positioned at substantially the center in the thickness direction of the liquid crystal layer and in each domain when the substrates are viewed in plane.

As shown in FIG. 3, in a picture element 8, the vertical alignment films 5a and 5b are exposed from directions A and B that are opposite and parallel to each other as the substrates are viewed in plane. The directions of the photo-irradiation to the vertical alignment films 5a and 5b are set to be different from each other by substantially 90° when the first substrate 1 is attached to the second substrate 2, as shown in FIGS. 3 and 4. As a result, in each domain, a pretilt direction (alignment treatment direction) which the vertical alignment film 5a regulates and a pretilt direction (alignment treatment direction) which the vertical alignment film 5b regulates are different from each other by about 90° in each domain. Accordingly, in each domain, the liquid crystal molecules that are positioned near the vertical alignment films 5a and 5b are aligned in accordance with the pretilt directions which the vertical alignment films 5a and 5b regulate when the substrates are viewed in plane. In addition, in the liquid crystal layer thickness direction, the liquid crystal molecules are twisted 90° in such a way that the pretilt direction smoothly varies from the pretilt direction which the vertical alignment film 5a regulates to the pretilt direction which the vertical alignment film 5b regulates. As shown in FIG. 4, the liquid crystal molecule 3a is aligned in a direction different from the photo-irradiation direction by about 45° as the substrates are viewed in plane. The liquid crystal molecules 3a are tilted in four directions different depending on the domain. Thus, in the liquid crystal display panel 100, the liquid crystal molecules are twisted about 90° between the vertical alignment films whose pretilt directions (alignment treatment directions) are perpendicular to each other. So the liquid crystal display panel 100 is in 4 domain-VATN mode. Each picture element 8 is divided into eight regions, but the liquid crystal molecules 3a are aligned in four different tilt directions. Therefore, the liquid crystal display panel 100 is a four domain-liquid crystal display panel.

A dark line appears between adjacent domains (at a domain boundary) in such a multi-domain liquid crystal display panel 100. The reason why the dark line appears between adjacent domains is mentioned below. When a voltage is applied, the liquid crystal molecules in each domain of the multi-domain pixel (picture element) are tilted in the same direction, but the liquid crystal molecules in different domains are tilted in different directions. Further, the liquid crystal molecule is a continuous elastic body. Between the different domains, the liquid crystal molecules are aligned so that liquid crystal molecules aligning in different directions are continuously connected. Accordingly, as shown in FIG. 4, between different domains (domain boundary), for example, in four domain-alignment, the alignment direction of the liquid crystal molecules is substantially the same or substantially perpendicular to the polarization axis direction of the polarization plate when the liquid crystal display panel is viewed in front. A polarized light that passes through this region where the liquid crystal molecules are aligned in a direction substantially the same or substantially perpendicular to the polarization axis direction of the polarization plate is not retarded by the liquid crystal molecules. Accordingly, in this region, the polarized light that has passed through the polarization plate that is arranged on the backlight side is not influenced by the liquid crystal layer and blocked by the polarization plate that is arranged on the display screen side. As a result, the region where the liquid crystal molecules are aligned in the direction substantially the same or substantially perpendicular to the polarization axis direction of the polarization plate, that is, the boundary between adjacent domains (domain boundary) appears as a dark line with a low luminance (corresponding to the dark line in the present description). Each picture element 8 includes a pixel electrode that overlaps with each picture element region. As a result, in the display region 31, a dark line (an edge dark line) that appears due to an oblique electric field generated at an edge of the picture element electrode may appear.

The four-domain VATN mode has an advantage in that the number of apparatus and the time for the alignment treatment (tact time) can be reduced because four domains different in alignment direction of the liquid crystal molecules 3a can be formed just by performing exposure twice for each of the first substrate 1 and the second substrate 2, totally four times, as shown in FIG. 3. Further, the embodiment in which one pixel (one picture element) is divided into four domains is preferable in order to improve viewing angle characteristics of a liquid crystal display panel. In addition, a photomask that is used for forming an alignment control structure such as a rib (projection), which is used in a conventional MVA mode and the like, is not needed, that is, photolithography does not need to be performed. As a result, the production processes can be simplified. If one pixel (one picture element) is divided into two domains, the viewing angle characteristics in one of the vertical direction and the horizontal direction can be improved, but the viewing angle characteristics in the other direction can not be improved. It is not recommended that one pixel is divided into five or more domains because the production processes become complex and the treatment needs more time. Further, it has been known that the viewing angle characteristics are not so different practically between four domains and five or more domains.

According to the present Embodiment, the polarization plates 6a and 6b are arranged in such a way that a polarization axis direction P of the polarization plate 6a is substantially perpendicular to a polarization axis direction Q of the polarization plate 6b as the panel (substrates) is viewed in plane. The polarization plates 6a and 6b are arranged in such a way that one of the polarization axis direction P of the polarization plate 6a and the polarization axis direction Q of the polarization plate 6b is the same as the direction of photo-irradiation to the vertical alignment film 5a and the other is the same as the direction of photo-irradiation to the vertical alignment film 5b. Accordingly, when a voltage is applied, light incident from the polarization plate 6a side is polarized in the polarization axis direction P and then rotated by 90° along the twist of the liquid crystal molecules in the liquid crystal layer 3, and then turned into light polarized in the polarization axis direction Q and emitted from the polarization plate 6b. When no voltage is applied, the liquid crystal molecules in the liquid crystal layer 3 remain to be vertically aligned, and so light polarized in the polarization axis direction P passes through the liquid crystal layer 3 without being rotated, and then blocked by the polarization plate 6b. Thus, the liquid crystal display panel 100 is a normally black liquid crystal display panel. The term "polarization axis" used herein means an absorption axis. The polarization axis direction P of the polarization plate 6a and the polarization axis direction Q of the polarization plate 6b are not especially limited to the directions shown in FIG. 4, respectively, and they may be appropriately determined. It is preferable that the polarization axis directions of the pair of polarization plates 6a and 6b are different from each other by about 90° when the panel (substrates) is viewed in plane. It is preferable that the polarization plates 6a and 6b are arranged in a Cross-Nicol relationship.

According to the present Embodiment, the vertical alignment liquid crystal display panel is mentioned. However, the liquid crystal display panel in the present Embodiment may be a horizontal alignment liquid crystal display panel. In such a case, the liquid crystal layer 3 includes nematic liquid crystal materials with positive dielectric anisotropy (positive nematic liquid crystal materials), and instead of the vertical alignment films 5a and 5b, horizontal alignment films may be arranged on the liquid crystal layer 3 side surfaces of the first and second substrates 1 and 2.

A production method of the liquid crystal display panel in accordance with Embodiment 1 is mentioned below. FIG. 5(a) is a plan view schematically showing the first substrate (TFT array substrate) in accordance with Embodiment 1. FIG. 5(b) is a plan view schematically showing the second substrate (CF substrate) in accordance with Embodiment 1.

First, the pair of substrates, the first substrate 1 and the second substrate 2, on which an alignment film is not arranged, are produced by a common method. The following TFT array substrate is used as the first substrate 1, for example. As shown in FIG. 5(a), on an insulating substrate (not shown) such as a glass substrate, scanning signal lines 9, drawing wirings 19, TFTs 11, data signal lines 10, and pixel electrodes 12 are successively arranged so that the scanning signal lines 9 and the data signal lines 10 are arranged in a lattice pattern with an insulating film (not shown) therebetween. At each intersection of the scanning signal lines 9 and the data signal lines 10, the TFT 11 and the pixel electrode 12 are arranged, and the drawing wiring 19 is connected to the scanning signal line 9 and the data signal line 10. Thus, a region where the pixel electrodes 12 are arranged is a display region 31, and a surrounding region where the pixel electrodes 12 are arranged in a matrix pattern is a frame region 32. The drawing wirings 19 are arranged in the frame region 32. The drawing wiring 19 connected to the scanning signal line 9 may be formed from the same layer as a layer where the scanning signal line 9 is formed, and the drawing wiring 19 connected to the data signal line 10 may be formed from the same layer as a layer where the data signal line 10 is formed.

The following CF substrate is used as the second substrate 2, for example. As shown in FIG. 5(b), on an insulating substrate (not shown) such as a glass substrate, a black matrix (BM) 13, a color filter 14 composed of colored layers of three colors, red (R), blue (G), and green (B), a protective film (not shown), and a transparent electrode film (not shown) are successively arranged. Thus, the BM 13 is formed in a lattice pattern between the picture elements (the pixel electrodes 12) and formed in a band shape to surround a region where the picture elements are arranged, and the color filter 14 is formed in each region surrounded by the BM 13. Thus, according to the present Embodiment, one pixel is composed of three picture elements of RGB arrayed in an x-axis direction (in the lateral direction as the display face is viewed in front). The region where the BM 13 is formed in a lattice pattern is the display region 31 and the region where the BM 13 is formed in a band shape is the frame region 32. The frame region 32 is light-shielded by the BM 13, but as mentioned above, the thickness of the BM 13, which is generally formed of a black resin, tends to be reduced recently. So light leakage from a region where no drawing wiring 19 is arranged in the frame region 32 can not be prevented even if the BM 13 is arranged in the frame region 32 as a light-shielding member. The insulating substrate that is used for the first substrate 1 and the second substrate 2 is not especially limited to a glass substrate as long as it has an insulating surface. A material commonly used may be mentioned as a material for the first substrate 1 and the second substrate 2.

Then, a solution containing a material for the photo-alignment film is applied to the first substrate 1 and the second substrate 2 by spin casting and the like, and then the material is calcined at 180° C. for 60 minutes, and as a result, vertical alignment films 5a and 5b are formed. The material is not especially limited, and a resin containing a photosensitive group and the like is mentioned. More specifically, polyimide containing a photosensitive group such as a 4-chalcone group (the following formula (1)), a 4'-chalcone group (the following formula (2), a coumarin group (the following formula (3)), and a cinnamoyl group (the following formula (4)) is preferable, for example. The photosensitive groups represented by the formulae (1) to (4) undergo a crosslinking reaction (including dimerization reaction), an isomerization reaction, a photo reorientation, and the like by light (preferably UV light). If these materials are used, a variation in pretilt angle of the liquid crystal molecules in the alignment film plane can be effectively suppressed in comparison to the case where a photo decomposition material is used as a material for the photo-alignment film. The photosensitive groups represented by the following formulae (1) to (4) may have a structure in which a substituent group is bonded to a benzene ring. A cinnamate group ($C_6H_5$—CH=CH—COO—) in which an oxygen atom is further bonded to a carbonyl group in the cinnamoyl group represented by the following formula (4) has the advantage of being easily synthesized. Accordingly, polyimide containing such a cinnamate group is more preferable as the material for the photo-alignment film. The calcination temperature, the calcination time, and the thickness of the photo-alignment film are not especially limited and they may be appropriately determined.

[Formula 1]

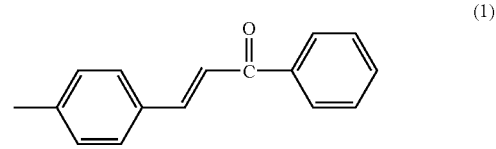

(1)

[Formula 2]

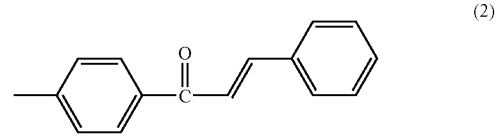

(2)

[Formula 3]

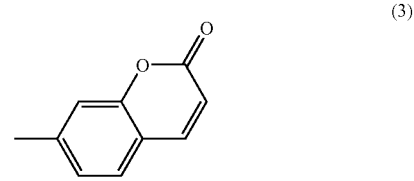

(3)

[Formula 4]

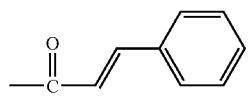

(4)

According to the present Embodiment, a photo-alignment material that is a photo-reactive material and provides a liquid crystal molecule with a pretilt angle in an irradiation direction of a light beam is used. A photo alignment film material that can regulate a pretilt direction in accordance with a moving direction of a photo-irradiation region can be used, as disclosed in "Photo-Rubbing Method: A Single-Exposure Method to Stable Liquid-Crystal Pretilt Angle on Photo-Alignment Film," M. Kimura and three et al, IDW' 04: proceedings of the 11th International Display Workshops, IDW' 04 Publication committee, 2004, and LCT2-1, p. 35-38". In this case, there is no need to cause light to enter the substrate from an oblique direction, and light can be caused to enter the substrate substantially vertically.

Procedures for exposing the alignment film are mentioned below. FIG. 6 is a schematic view showing an embodiment of scanning exposure for an alignment film (substrate) in the exposure step (the 1st scan) in accordance with Embodiment 1. FIG. 6(*a*) is a plan view. FIG. 6(*b*) is a side view. In FIG. 6(*b*), the black arrow shows an irradiation direction of a polarized UV light (photo-irradiation direction), and the white arrow shows a moving direction of the first substrate. FIG. 7 is a cross-sectional view schematically showing an embodiment of photo-irradiation to the alignment film (substrate) in the exposure step in accordance with Embodiment 1. FIG. 8 is a schematic view showing an embodiment of scanning exposure for an alignment film (substrate) in the exposure step (the 2nd scan) in accordance with Embodiment 1. FIG. 8(*a*) is a plan view. FIG. 8(*b*) is a side view. In FIG. 8(*b*), the black arrow shows an irradiation direction of a polarized UV light (photo-irradiation direction), and the white arrow shows a moving direction of the first substrate. An upper part of FIG. 9 is a front view schematically showing an embodiment of a photomask, specifically, a part that is used for exposing a display region in the first substrate in the exposure step (the 1st and 2nd scan) in accordance with Embodiment 1. A lower part of FIG. 9 is a front view schematically showing picture elements in the first substrate where the alignment film is exposed through the photomask shown in the upper part. In FIG. 9, the black arrow shows a photo-irradiation direction. An upper part of FIG. 10 is a front view schematically showing an embodiment of a photomask, specifically, parts that are used for exposing a display region and a frame region in the first substrate in the exposure step (the 1st and 2nd scan) in accordance with Embodiment 1. A lower part of FIG. 10 is a front view schematically showing a display region near a corner of the first substrate where the alignment film is exposed through the photomask shown in the upper part. This lower part also shows dark lines (gray lines) that can appear in the case that the alignment film is exposed through this photomask. A left part of FIG. 11 is a front view schematically showing an embodiment of a photomask, specifically, parts that are used for exposing a display region and a frame region in the second substrate in the exposure step (the 1st and 2nd scan) in accordance with Embodiment 1. A right part of FIG. 11 is a front view schematically showing a display region near a corner of the second substrate where the alignment film is exposed through the photomask shown in the upper part. The right part also shows dark lines (gray lines) that can appear when the alignment film is exposed through this photomask.

According to the present Embodiment, the alignment film is exposed by scanning exposure or shot exposure. The scanning exposure is mentioned below.

Steps of exposure for the first substrate are mentioned. A photomask 20*a* shown in FIG. 6(*a*) is used. The photomask 20*a* has a mask part 21*a* (a first mask part) and a mask fine part 22*a* (a second mask part) arranged on both sides of the mask part 21*a*. The photomask 20*a* has a plurality of slits extending toward a moving direction mentioned below of the first substrate 1 (an x-axis direction in FIG. 6, a vertical direction as the display face is viewed in front), and the plurality of slits are arrayed in a direction perpendicular to the moving direction of the first substrate 1 (an y-axis direction in FIG. 6, a lateral direction as the display face is viewed in front). That is, the photomask 20*a* has a slit pattern. More specifically, the mask part 21*a* has a plurality of slits 25*a* each having a rectangular shape as viewed in plane, within a light-shielding region. Each slit 25*a* has a width substantially half of a pitch of picture elements in the y-axis direction. The plurality of slits 25*a* are arranged at a pitch substantially the same as the pitch of picture elements in the y-axis direction. The mask fine part 22*a* has a plurality of slits 25*b* each having a rectangular shape as viewed in plane. The plurality of slits 25*b* are arranged substantially parallel to the slits 25*a*. Each slit 25*b* is finer than the slit 25*a* that is used for exposing the display region 31. More specifically, the width of each slit 25*b* is smaller than the width of each slit 25*a* in the y-axis direction, and further, the slits 25*b* are arranged at a pitch smaller than a pitch of the slits 25*a* in the y-axis direction. The width and pitch of the slits 25*b* may be appropriately determined, but in view of alignment accuracy of an exposure apparatus, it is preferable that the slit 25*b* has a width of about 12 μm to 20 μm and that the slits 25*b* are arranged at a pitch of about 24 μm to 40 μm. In order to more suppress light leakage by increasing the number of dark lines (area of dark lines) in the frame region, the width of the slit 25*b* in the mask fine part 22*a* may be smaller than values within the above-mentioned range, and also the slits 25*b* may be arranged at a pitch smaller than values within the above-mentioned range. However, in view of alignment accuracy of an exposure apparatus or a blurred dark line, the advantages of the present invention (suppression of light leakage) are not improved any more even if the width and the pitch of the slit 25*b* are further decreased. So it is preferable that the width and the pitch of the slit 25*b* are within the above-mentioned ranges, respectively.

As shown in FIG. 6(*a*), the photomask 20*a* and the first substrate 1, each produced in the above-mentioned manner, are arranged so that the mask part 21*a* overlaps with the display region 31 and the mask fine part 22*a* overlaps with only the frame region 32. Thus, the photomask 20*a* has the two mask fine parts 22*a* and the mask part 21*a*. The two mask fine parts 22*a* overlap with only the frame region 32. The mask part 21*a* overlaps with the display region 31 and a region adjacent to the display region 31 in the longitudinal direction of the slit 25*a* in the frame region 32. The mask fine part 22*a* is adjacent to the mask part 21*a* in the latitudinal direction of the slit 25*a* in the mask part 21*a* (in the direction perpendicular to the moving direction of the first substrate 1). As a result, the alignment film in the display region 31 and the frame region 32 can be efficiently exposed through the photomask 20*a*. A light source (not shown) is arranged above the photomask 20*a*.

The position between the slits 25*a* of the photomask 20*a* and the picture elements in the first substrate 1 is adjusted, and then, as shown in FIG. 6(b), a polarized UV light (shown by the black arrow in FIG. 6(b)) is radiated to the first substrate 1 while the first substrate 1 is moved in −x direction (shown by the white arrow in FIG. 6(b)), thereby exposing the vertical alignment film 5a, which is arranged on the first substrate 1 surface, from one end to the other through the photomask 20a (the 1st scan). In this case, the first substrate 1 is moved so that the slit 25a is positioned along the bus wirings such as the data signal line 10 and the scanning signal line 9, which is arranged on the first substrate 1. As shown in FIGS. 6(b) and 7, the first substrate 1 is irradiated with polarized UV light 15 from an oblique direction. The polarized UV light 15 is radiated to the first substrate 1 from the longitudinal direction of the slits 25a and 25b as the first substrate 1 is viewed in plane. The photomask 20a and the first substrate 1 are arranged with a certain distance (a proximity gap 16). Attributed to this distance, the first substrate 1 is moved smoothly, and even if the photomask 20a sags under its own weight, the photomask 20a is suppressed from being in contact with the first substrate 1. As a result of the 1st scan, each about a half pixel (each about a half picture element) in the display region 31 and about a half of the frame region 32 are provided with the alignment treatment. As shown in FIG. 7, the liquid crystal molecules 3b, which are positioned near the vertical alignment film 5a surface, each have a pretilt angle 17. This pretilt angle 17 is substantially uniform in each exposure region. The scanning exposure in the present invention may have an embodiment in which the substrate is fixed and the photomask and the light-source are moved.

The first substrate 1 is rotated 180° in the substrate plane, and then as shown in FIG. 8(a), the position between the slits 25a in the mask part 21a and the picture elements in the first substrate 1 is adjusted so that each slit 25a is positioned in an unexposure region of each picture element. In this case, the slit 25b in the mask fine part 22a is positioned in an unexposure region of the frame region 32. Then, as shown in FIG. 8(b), a polarized UV light (shown by the black arrow in FIG. 8(b)) is radiated to the first substrate 1 while the first substrate 1 is moved in +x direction (shown by the white arrow in FIG. 8(b), the direction opposite to that shown in FIG. 6(b)), thereby exposing the vertical alignment film 5a, which is arranged on the first substrate 1 surface, from one end to the other through the photomask 20a (the 2nd scan), as performed in the 1st scan shown in FIG. 6(b). As a result of the 2nd scan, the rest substantially half region of each pixel (each picture element) and the rest substantially half region of the frame region 32 are provided with alignment treatment, and thus, the entire region of the vertical alignment film 5a, which is on the first substrate 1, is exposed. The light source and the photomask 20a are fixed during the 1st and 2nd scan. So an incident angle of the light beam (shown by the black arrow in FIG. 8(b)) in the 2nd scan with respect to the first substrate 1 is substantially the same as an incident angle of the light beam (shown by the black arrow in FIG. 6(b)) in the 1st scan with respect to the first substrate 1. In addition, the first substrate 1 is rotated 180° before the 2nd scan, and so the direction of the light beam radiated to the first substrate 1 (the photo-irradiation direction) in the 1st scan is just opposite to the direction of the light beam radiated to the first substrate 1 (the photo-irradiation direction) in the 2nd scan when the first substrate 1 is viewed in plane, as shown in the upper part in FIG. 9. That is, in the display region 31, each picture element 8 in the first substrate 1 (a picture element 8R, a picture element 8G, a picture element 8B) is divided into two regions different in alignment direction, as shown in FIG. 3(a) and the lower part of FIG. 9. The alignment directions of the two regions are opposite and parallel to each other. In a liquid crystal display panel including thus-exposed first substrate 1, a plurality of dark lines appear when an image is displayed in an intermediate or higher gradation level on a display screen and the image is viewed in front. As shown in FIG. 10, a plurality of dark lines 27a (first dark lines) each appearing between adjacent exposure regions, i.e., adjacent domains, (domain boundary which corresponds to the boundary between the slits 25a in the photomask 20a), appear at a constant pitch in the display region 31. In addition, a plurality of dark lines 27b (second dark lines) each appearing between adjacent exposure regions, i.e., adjacent domains, (domain boundary which corresponds to the boundary between the slits 25b in the photomask 20a), appear at a constant pitch in the frame region 32. The dark lines 27a and 27b are parallel to each other, but, the pitch of the dark lines 27a is different from that of the dark lines 27b. A pitch Wb of the dark lines 27b is smaller than a pitch Wa of the dark lines 27a.

The vertical alignment film 5b, which is arranged on the second substrate 2, is also exposed through a photomask 20b having a slit pattern, similarly to the first substrate. That is, exposure (1st and 2nd scan) is performed using the photomask 20b having a mask part 21b where slits 25c are arranged and a mask fine part 22b where slits 25d finer than the slits 25c are formed. In this case, the slit 25c has a width about quarter of a pitch of the picture elements in the direction perpendicular to the moving direction of the second substrate 2 (the y-axis direction in FIG. 11, the vertical direction as the display face is viewed in front). Further, the slits 25c are arranged at a pitch about half of the pitch of the picture elements in the y-axis direction. A plurality of slits 25d are arranged substantially parallel to the slits 25c. The width of each slit 25d is smaller than the width of each slit 25c in the y-axis direction, and further, the slits 25d are arranged at a pitch smaller than a pitch of the slits 25c in the y-axis direction. The width and pitch of the slits 25d in the mask fine part 22b may be appropriately determined, but in view of alignment accuracy of an exposure apparatus, it is preferable that the slit 25d has a width of about 12 μm to 20 μm and that the slits 25d are arranged at a pitch of about 24 μm to 40 μm.

Thus, in the display region 31, each picture element in the second substrate 2 is divided into two regions different in alignment direction, as shown in FIG. 3(b). The alignment directions of the two regions are opposite and parallel to each other. As shown in FIG. 7, liquid crystal molecules that are positioned near a surface of the vertical alignment film 5b, which is arranged on the second substrate 2, each have a pretilt angle. This pretilt angle is substantially uniform in each domain, similarly to the first substrate 1. In a liquid crystal display panel including thus-exposed second substrate 2, a plurality of dark lines appear when an image is displayed in an intermediate or higher gradation level on a display screen and the image is viewed in front. As shown in FIG. 11, a plurality of dark lines 27c (third dark lines) each appearing between adjacent exposure regions, i.e., adjacent domains, (domain boundary which corresponds to the boundary between the slits 25c in the photomask 20b), appear at a constant pitch in the display region 31. In addition, a plurality of dark lines 27d (fourth dark lines) each appearing between adjacent exposure regions, i.e., adjacent domains, (domain boundary which corresponds to the boundary between the slits 25d in the photomask 20b), appear at a constant pitch in the frame region 32. The dark lines 27c and 27d are parallel to each other, but the pitch of the dark lines 27c is different from that of the dark lines 27d. A pitch Wd of the dark lines 27d is smaller than a pitch Wc of the dark lines 27c.

Thus, one picture element is divided into four domains in the present Embodiment. That is, the alignment division is performed in the following manner: the TFT array substrate is exposed through the photomask where the transmissive parts are arranged in a stripe pattern, each of the transmissive parts having a width about half of the picture element pitch in the lateral direction (the x-axis direction in FIG. 5) when the display face of the liquid crystal display panel is viewed in front; and the CF substrate is exposed through the photomask where the transmissive parts are arranged in a stripe pattern, each of the transmissive parts having a width about quarter of the picture element pitch in the vertical direction (the y-axis direction in FIG. 5, the picture element pitch and the pixel pitch in the vertical direction are the same in the present Embodiment). The pattern of the transmissive parts is not especially limited, and it may be appropriately determined depending on a layout of the pixel (picture element), a pixel (picture element) size, a resolution of a panel, and the like. According to the present Embodiment, the four domains are arranged in a matrix pattern. The pattern in which the four domains are arranged is not especially limited, and a horizontal-stripe pattern may be mentioned. In addition, if each picture element is further divided into some sub-pixels, the photomask has a slit pattern for alignment division of each sub-pixel.

Usable materials and suitable conditions of the production processes in the present Embodiment are mentioned below, but not limited thereto. The light beam for the exposure is not especially limited a polarized CV light, and it may be appropriately determined depending on the alignment film material, the production process, and the like. Non-polarized light (extinction ratio=1:1) may be used.

Liquid crystal material: nematic liquid crystal having a birefringence $\Delta n$ of 0.06 to 0.14, a dielectric anisotropy $\Delta \epsilon$ of −2.0 to −8.0, a Tni (transition temperature of nematic-anisotropic phase) of 60° C. to 110° C.

Pretilt angle: 85° to 89.9°

Cell gap: 2 µm to 5 µm

Irradiation energy density: 0.01 to 5 J/cm$^2$

Proximity gap: 10 µm to 250 µm

Light source: a low pressure mercury lamp, a high pressure mercury lamp, a heavy hydrogen lamp, a metal halide lamp, an argon resonance lamp, a xenon lamp, an excimer laser Extinction ratio of polarized UV light (polarization degree): 1:1 to 60:1

Irradiation direction of UV light: a direction that makes an angle of 0° to 60° with the normal direction of the substrate surface A step of attaching the first substrate 1 to the second substrate 2 is mentioned below. In this attachment step, a sealing member is arranged around the first substrate 1 or the second substrate 2, prepared as above. Then, plastic beads each having a diameter of 4 µm are sprayed on the substrate 1 or 2 on which the sealing member has been arranged, and then, the first substrate 1 and the second substrate 2 are attached to each other. The relationship of the light beam-irradiation direction of the both substrates in one picture element is as shown in FIG. 4. The scanning directions for the substrates facing each other are substantially perpendicular to each other in each domain.

Then, the above-mentioned liquid crystal materials are injected between the first substrate 1 and the second substrate 2, and the liquid crystal molecules exhibit pretilt angles different depending on the domain. As a result, in each domain, the liquid crystal molecules 3*a*, which is positioned near the center in the in-plane direction and in the thickness direction of the liquid crystal layer 3, are aligned at 45° with respect to the light beam-irradiation direction when the substrate is viewed in plane as shown in FIG. 4.

The retarder 7*a* and the polarization plate 6*a* are attached to the external side-surface of the first substrate 1 and the retarder 7*b* and the polarization plate 6*b* are attached to the external side-surface of the second substrate 2. The two polarization plates 6*a* and 6*b* are attached so that their polarization axes are in a relationship shown in FIG. 3. As a result, the liquid crystal molecules are almost vertically aligned when no voltage is applied, and so the liquid crystal display panel 100 in the present Embodiment provides excellent black display (excellent normally black display). The liquid crystal display panel 100 in the present Embodiment shows display characteristics hardly depending on a viewing direction because one pixel (one picture element) is divided into four domains different in alignment direction of liquid crystal molecules.

Then, after common module-producing steps, a liquid crystal display device in the present Embodiment is completed.

A display screen of the liquid crystal display device in the present Embodiment is mentioned below. FIG. 12 is a front view schematically showing a display region near a corner in the liquid crystal display device in accordance with Embodiment 1 when an image is displayed in an intermediate or higher gradation level.

According to a liquid crystal display device 200 in the present Embodiment, when an image is displayed in an intermediate or higher gradation level (white, for example) on the display screen and this image is viewed in front, a plurality of dark lines 27*a* and a plurality of dark lines 27*b* appear in the x-axis direction (the lateral direction as the display face is viewed in front), and a plurality of dark lines 27*c* and a plurality of dark lines 27*d* appear in the y-axis direction (the vertical direction as the display face is viewed in front) as in FIG. 12. The plurality of dark lines 27*a* each appearing between adjacent domains (domain boundary) in the display region 31 appear at a constant pitch, and further, the plurality of dark lines 27*b* each appearing between adjacent domains (domain boundary) in the frame region 32 appear at a constant pitch. The plurality of dark lines 27*c* each appearing between adjacent domains (domain boundary) in the display region 31 appear at a constant pitch. The plurality of dark lines 27*d* each appearing between adjacent domains (domain boundary) in the display region 32 appear at a constant pitch. The dark lines 27*a* and 27*b* are parallel to each other, and the dark lines 27*c* and 27*d* are parallel to each other. A pitch Wb of the dark lines 27*b* is smaller than a pitch Wa of the dark lines 27*a*, and a pitch Wd of the dark lines 27*d* is smaller than a pitch Wc of the dark lines 27*c*. In the display region 31, a dark line having a swastika shape appears because in addition to the dark lines 27*a*, the edge dark line (not shown) appears in the display region 31 and they are united.

When an image is displayed in an intermediate or higher gradation level on the display screen of the liquid crystal display device 200 and this image is viewed in front, the dark lines 27*a* and 27*c* appear in the display region 31, and the dark lines 27*b* and 27*d* appear in the frame region 32. Pitches of the dark lines 27*b* and 27*d* are smaller than those of the dark lines 27*a* and 27*c*. Compared with a conventional liquid crystal display device where a pitch of dark lines is the same between the display region and the frame region, light leakage from a region where no drawing wirings 19 are arranged of the frame region 32 can be more suppressed in the liquid crystal display device 200 because the number and area of the dark lines 27*b* and 27*d* are intentionally increased in the frame region 32. These dark lines 27*b* and 27*d* continue to be dark regions also when a white image is displayed. So even if an electric field generated by the drawing wiring 19 and the like influences the dark lines 27b and 27d, the frame region 32 is light-shielded by the dark lines 27b and 27d.

According to the present Embodiment, the exposure for the first substrate 1 and the second substrate 2 facing each other is performed using the photomask where slits through which the display region 32 is exposed are arranged at a smaller pitch. So at corners of the frame region in the device 200, dark lines appear in a lattice pattern because the dark lines 27b and 27d, which are arranged at a smaller pitch, are substantially perpendicular to each other. As a result, a light-shielding ratio in the frame region 32 can be more increased attributed to the dark lines.

The scanning exposure for the alignment film is mentioned above, but the alignment film may be exposed by shot exposure in the production method of the liquid crystal display device in the present Embodiment. FIG. 13 is a schematic view showing an embodiment of shot exposure for an alignment film (substrate) in the exposure step in accordance with Embodiment 1. FIG. 13(a) is a plan view. FIG. 13(b) is a side view. In FIG. 13(b), the black arrow shows an irradiation direction of a polarized UV light (photo-irradiation direction).

The alignment film (the display region 31 and the frame region 32), which is arranged on the substrate 18 (the first substrate 1 and/or the second substrate 2), is exposed at one time using a photomask 20c having a mask part 21c and a mask fine part 22c, with the substrate 18 and a light source (not shown), which is arranged above the photomask 20c, being fixed. Similarly to the scanning exposure, the mask fine part 22c have slits 25f, and each slit 25f has a width smaller than a width of a slit 25e in the mask part 21x and the slits 25f are arranged at a pitch smaller than a pitch of the slits 25e. In the shot exposure, the substrate 18 or the photomask 20c is moved by about half or about quarter of a picture element pitch in a direction perpendicular to the longitudinal direction of the slits 25e and 25f after the first exposure (the 1st shot) and before the second exposure (the 2nd shot), and thereby, the position between the slits 25e in the mask part 21c and picture elements in the substrate 18 is adjusted so that the slit 25e is positioned in an unexposure region of each picture element in the 2nd shot. As mentioned above, in the shot exposure, the substrate 18 does not need to be rotated 180° in the substrate plane, but a direction of photo-irradiation to the substrate face needs to be changed between the 1st shot and the 2nd shot, for example, by changing a position of the light source.

According to the production method of the liquid crystal display device in the present Embodiment, the photomask that is used for the 1st scan may be also used for the 2nd scan just by moving the position of the photomask. An upper part of FIG. 14 is a front view schematically showing another embodiment of a photomask, specifically, parts that are used for exposing a display region and a frame region of a substrate in the exposure step in accordance with Embodiment 1. A lower part of FIG. 14 is a front view schematically showing a display region near a corner of the substrate where the alignment film is exposed through the photomask shown in the upper part. The lower part also shows dark lines (gray lines) that can appear when the alignment film is exposed in this photomask.

In this case, similarly to the photomask 20a and the like, the photomask 20d includes slits 25g through which the display region 31 is exposed and slits 25h through which the frame region 32 is exposed. The width of the slit 25h is smaller than that of the slit 25g. The slits 25h are arranged at a pitch smaller than that of the slits 25g. A pair of the slit 25h and a light-shielding region (black and white pair) is inverted in accordance with a moving distance of the photomask 20d between the 1st scan and the 2nd scan (pitch shift amount). The 1st scan is performed using this photomask 20d, and the photomask 20d is moved by about half the picture element pitch, and then the 2nd scan is performed. As a result, a region where a plurality of dark lines 27f appear at a pitch smaller than a pitch of a plurality of dark lines 27e appearing in the display region 31 can be formed in the frame region 32, and so the alignment film (the vertical alignment film 5a and/or the vertical alignment film 5b) has no unexposure part also in the region which is exposed through the slits 25h that are formed at a smaller pitch. Thus, the substrate does not need to be rotated 180° in the substrate plane when the position of the photomask is changed between the 1st exposure and the 2nd exposure. However, in this case, similarly to the shot exposure, a direction of photo-irradiation to the substrate face needs to be changed between the 1st shot and the 2nd shot, for example, by changing a position of a light source. This embodiment may be applied to the shot exposure.

According to the present Embodiment, the mask fine part has the slits that are formed at a constant pitch, but the pitch is not necessarily constant and the slits may be formed randomly.

Embodiment 2

Embodiment 2 is mentioned below. The overlapping contents between the present Embodiment and Embodiment 1 are omitted and not shown in drawings because a difference between the two is just an embodiment of the slits through which the frame region is exposed of the photomask. FIG. 15 is a schematic view showing an embodiment of exposure for an alignment film (a second substrate) in the exposure step (the 1st scan) in accordance with Embodiment 2. FIG. 15(a) is a plan view of a photomask. FIG. 15(b) is a plan view of the second substrate. FIG. 16 is a schematic view showing an embodiment of exposure for the alignment film (the second substrate) in the exposure step (the 2nd scan) in accordance with Embodiment 2. FIG. 16(a) is a plan view of the photomask. FIG. 16(b) is a plan view of the second substrate. FIG. 17 is a plan view schematically showing one picture element in a display region of a liquid crystal display panel in accordance with Embodiment 2. FIG. 17(a) shows a direction of photo-irradiation to a vertical alignment film. FIG. 17(b) shows an alignment direction of a liquid crystal molecule when a voltage is applied. FIG. 17(c) shows a dark line appearing when an image is displayed in an intermediate or higher gradation level. In FIG. 17(a) the solid arrow shows a direction of photo-irradiation to a first substrate, and the dot arrow shows a direction of photo-irradiation to the second substrate. FIG. 17(b) shows a liquid crystal molecule that is positioned at substantially the center in the thickness direction of the liquid crystal layer and in each domain when the substrate is viewed in plane. FIG. 18 is a plan view schematically showing one picture element in a frame region of the liquid crystal display panel in accordance with Embodiment 2. FIG. 18(a) shows a direction of photo-irradiation to a vertical alignment film. FIG. 18(b) shows an alignment direction of a liquid crystal molecule when a voltage is applied. FIG. 18(c) shows a dark line appearing when an image is displayed in an intermediate or higher gradation level. In FIG. 18(a), the solid arrow shows a direction of photo-irradiation to the first substrate, and the dot arrow shows a direction of photo-irradiation to the second substrate. FIG. 18(b) shows a liquid crystal molecule that is positioned at substantially the center in the thickness direction of the liquid crystal layer and in each domain when the substrate is viewed in plane.

Exposure for a second substrate 2 is mentioned below. A photomask 20e in the present Embodiment has a mask part 21d (a first mask part) through which a display region 31 is exposed and a mask frame part 23a (a second mask part) through which a frame region 32 is exposed, as shown in FIG. 15(a). The mask part 21d has a plurality of slits 25i within a light-shielding region. The plurality of slits 25i each have a rectangular shape as viewed in plane. The slit 25i is arranged so that its longitudinal direction is in the lateral direction when the substrate is viewed in front. The width of the slit 25i is about quarter of a picture element pitch in the vertical direction when the second substrate 2 is viewed in front. The pitch of the slits 25i is about half the picture element pitch in the vertical direction when the second substrate 2 is viewed in front. The mask frame part 23a has a plurality of slits 25j within the light-shielding region. The plurality of slits 25j each have a rectangular shape as viewed in plane. The slit 25j is arranged so that its longitudinal direction is in the vertical direction when the substrate is viewed in front. Thus, the array direction of the slits 25i is perpendicular to that of the slits 25j. That is, the longitudinal direction of the slit 25i is perpendicular to that of the slit 25j. The width and pitch of the slits 25j are the same as those of the slits 25j, but may be appropriately determined.

Then, exposure procedures using the photomask 20e are mentioned. In the present Embodiment, the alignment film is exposed by shot exposure. More specifically, the second substrate 2 and the photomask 20e are arranged so that the mask part 21d overlaps with the display region 31 and the mask frame 23a overlaps with the frame region 32. The position between the slits 25i and the picture elements in the second substrate 2 is adjusted, and then, similarly to Embodiment 1, a polarized UV light is radiated to the second substrate 2 from a direction oblique thereto, thereby exposing the vertical alignment film 5b (the 1st shot). More specifically, the vertical alignment film 5b is exposed from the longitudinal direction of the slit 25i. As a result of the 1st shot, exposure regions 34a are formed in a stripe pattern in the display region 31 which is exposed through the slits 25i, and exposure regions 34b are formed in a stripe pattern in the frame region 32 which is exposed through the slits 25j. The longitudinal direction of the exposure region 34b having a stripe pattern is perpendicular to that of the exposure region 34a having a stripe pattern.

Then, the photomask 20e is moved in a direction oblique to the second substrate 2, as shown in FIG. 16(a). More specifically, the photomask 20e is moved by a pitch of the slits 25i in the vertical direction and by a pitch of the slits 25j in the lateral direction when the second substrate 2 is viewed in front. The position between the photomask 20e and the second substrate 2 is adjusted so that each slit 25i is positioned in an unexposure region of each picture element. Then, the vertical alignment film 5b is exposed from a direction opposite to the UV light-irradiation direction in the 1st shot, for example, after changing a position of a light source. As a result of the 2nd shot, as shown in FIG. 16(b), exposure regions 34c are formed in a stripe pattern in the display region 31 which is exposed through the slits 25i, and exposure regions 34d are formed in a stripe pattern in the frame region 32 which is exposed through the slits 25j, similarly to the 1st shot.

The first substrate 1 is also exposed twice (the 1st shot and the 2nd shot), thereby exposing the vertical alignment film 5a, similarly to the second substrate 2. As shown in FIGS. 17(a) and 18(a), the direction of radiating UV light to the first substrate 1 is perpendicular to that to the second substrate 2 both in the display region 31 and the frame region 32 when the first substrate 1 and the second substrate 2 are attached to each other.

As a result of the 1st and 2nd exposure, each picture element in the display region 31 is divided into four domains 28a, 28b, 28c, and 28d, as shown in FIG. 17(a). Also, each picture element in the frame region 32 is divided into four domains 28e, 28f, 28g, and 28h, as shown in FIG. 18(a). More specifically, as shown in FIG. 17(b), when the right horizontal direction is defined as 0° as the display face is viewed in front, a liquid crystal molecule 30a (hereinafter, also referred to as a "central liquid crystal molecule"), which is positioned at substantially the center in the thickness direction of the liquid crystal layer and in the domain 28a when the substrate is viewed in plane, has a tilt angle of 225°; a central liquid crystal molecule 30b has a tilt angle of 315° in the domain 28b; a central liquid crystal molecule 30c has a tilt angle of 45° in the domain 28c; and a central liquid crystal molecule 30d has a tilt angle of 135° in the domain 28d. Thus, the central liquid crystal molecules 30a, 30b, 30c, and 30d are tilted in a concentric pattern. As shown in FIG. 18(b), when the right horizontal direction is defined as 0° as the display face is viewed in front, a central liquid crystal molecule 30e has a tilt angle of 135° in the domain 28e; a central liquid crystal molecule 30f has a tilt angle of 225° in the domain 28f; a central liquid crystal molecule 30g has a tilt angle of 315° in the domain 28g; and a central liquid crystal molecule 30h has a tilt angle of 45° in the domain 28h. Thus, the central liquid crystal molecules 30e, 30f, 30g, and 30h are tilted in a radial pattern.

The tilt directions of the molecule 30a in the domain 28a and the molecule 30f in the domain 28f are the same; the tilt directions of the molecule 30b in the domain 28b and the molecule 30g in the domain 28g are the same; the tilt directions of the molecule 30c in the domain 28c and the molecule 30h in the domain 28h are the same; and the tilt directions of the molecule 30d in the domain 28d and the molecule 30e in the domain 28e are the same. Thus, the arrangement form of the domains 28a, 28b, 28c, and 28d in the display region 31 is different from that of the domains 28e, 28f, 28g, and 28h in the frame region 32.

A dark line 27g having a swastika shape appears at a boundary among the domains 28a, 28b, 28c, and 28d in the display region 31, as shown in FIG. 17(c). A dark line 17h having a lattice shape appears at a boundary among the domains 28e, 28f, 28g, and 28h in the frame region 32, as shown in FIG. 18(c). The width of the dark line 27h in the frame region 32 is larger than that of the dark line 27g in the display region 31. A region that is light-shielded by the dark line in the frame region 32 is larger than that in the display region 31.

Thus, according to the present Embodiment, the display region 31 and the frame region 32 are exposed through the two slits 25i and 25j that are arranged in directions different by 90°. As a result, the combination of the domains in the display region 31 is advantageous to an aperture, and the combination of the domains in the frame region 32 is disadvantageous to an aperture. In contrast to the present Embodiment, in a conventional liquid crystal display device, the combination of domains is the same between the display region and the frame region, and so the combination of domains in the frame region is also advantageous to an aperture. Accordingly, according to the present Embodiment, an area of a region light-shielded by the dark lines in the frame region 32 is larger than that in the conventional liquid crystal display device and so the light leakage can be suppressed.

In the present Embodiment, the width and pitch of the slits 25*j* are preferably smaller than those of the slits 25*i*, respectively, although they may be appropriately determined. As a result, the light leakage from the frame region 32 can be more suppressed.

Embodiment 3

Embodiment 3 is mentioned below. The overlapping contents between the present Embodiment and Embodiments 1 and 2 are omitted and are not shown in drawings because a difference between the two is just an embodiment of the transmissive parts through which the frame region is exposed of the photomask. FIG. 19 is a schematic view showing an embodiment of exposure for an alignment film (a second substrate) in the exposure step (the 1st shot) in accordance with Embodiment 3. FIG. 19(*a*) is a plan view of a photomask. FIG. 19(*b*) is a plan view of the second substrate. FIG. 20 is a schematic view showing an embodiment of exposure for the alignment film (the second substrate) in the exposure step (the 2nd shot) in accordance with Embodiment 3. FIG. 20(*a*) is a plan view of the photomask. FIG. 20(*b*) is a plan view of the second substrate. FIG. 21 is a plan view schematically showing one picture element in a display region of a liquid crystal display panel in accordance with Embodiment 3. FIG. 21(*a*) shows a direction of photo-irradiation to a vertical alignment film. FIG. 21(*b*) shows an alignment direction of a liquid crystal molecule when a voltage is applied. FIG. 21(*c*) shows a dark line appearing when an image is displayed in an intermediate or higher gradation level. In FIG. 21(*a*), the solid arrow shows a direction of photo-irradiation to a first substrate, and the dot arrow shows a direction of photo-irradiation to the second substrate. FIG. 21(*b*) shows a liquid crystal molecule that is positioned at substantially the center in the thickness direction of the liquid crystal layer and in each domain when the substrate is viewed in plane. FIG. 22 is a plan view schematically showing one picture element in a frame region of the liquid crystal display panel in accordance with Embodiment 3. FIG. 22(*a*) shows a direction of photo-irradiation to a vertical alignment film. FIG. 22(*b*) shows an alignment direction of a liquid crystal molecule when a voltage is applied. FIG. 22(*c*) shows a dark line appearing when an image is displayed in an intermediate or higher gradation level. In FIG. 22(*a*), the solid arrow shows a direction of photo-irradiation to the first substrate, and the dot arrow shows a direction of photo-irradiation to the second substrate. FIG. 22(*b*) shows a liquid crystal molecule that is positioned at substantially the center in the thickness direction of the liquid crystal layer and in each domain when the substrate is viewed in plane.

Exposure for a second substrate 2 is mentioned below. A photomask 20*f* in the present Embodiment has a mask part 21*e* (a first mask part) through which a display region 31 is exposed and a mask frame part 23*b* (a second mask part) through which a frame region 32 is exposed, as shown in FIG. 19(*a*). Similarly to the photomask 20*e* in Embodiment 2, the mask part 21*e* has a plurality of slits 25*k* within a light-shielding region. The plurality of slits 25*k* each have a rectangular shape as viewed in plane. The slit 25*k* is arranged so that its longitudinal direction is in the lateral direction when the substrate is viewed in front. The width of the slit 25*k* is about quarter of a picture element pitch in the vertical direction when the second substrate 2 is viewed in front. The pitch of the slits 25*k* is about half the picture element pitch in the vertical direction when the second substrate 2 is viewed in front. The mask frame part 23 has a plurality of dots 29 within the light-shielding region in a lattice pattern. The plurality of dots 29 each have a square shape as viewed in plane. The width (length of one side) and pitch of the dots 29 are the same as those of the slits 25*k*, respectively, but may be appropriately determined. The photomask 20*f* has transmissive parts formed in patterns different between the mask part 21*e* and the mask frame part 23*b*.

Then, exposure procedures using the photomask 20*f* are mentioned. In the present Embodiment, the alignment film is exposed by shot exposure. More specifically, the second substrate 2 and the photomask 20*f* are arranged so that the mask part 21*e* overlaps with the display region 31 and the mask frame part 23*b* overlaps with the frame region 32. The position between the slits 25*k* and the picture elements in the second substrate 2 is adjusted, and then, similarly to Embodiment 2, a polarized UV light is radiated to the second substrate 2 from a direction oblique thereto, thereby exposing the vertical alignment film 5*b* (the 1st shot). More specifically, the vertical alignment film 5*b* is exposed from the longitudinal direction of the slit 25*k*. As a result of the 1st shot, exposure regions 34*e* are formed in a stripe pattern in the display region 31 which is exposed through the slits 25*k*, and exposure regions 34*f* are formed in a lattice pattern in the frame region 32 which is exposed through the dots 29.

Then, the photomask 20*f* is moved by a pitch of the slits 25*k* in the vertical direction as the second substrate 2 is viewed in front, as shown in FIG. 20(*a*). Then, the position between the photomask 20*f* and the second substrate 2 is adjusted so that each slit 25*k* is positioned in an unexposure region of each picture element. Then, (as the second shot), the alignment film is exposed from a direction opposite to the UV light-irradiation direction in the 1st shot, for example, after changing a position of a light source. As a result of the 2nd shot, as shown in FIG. 20(*b*), exposure regions 34*g* are formed in a stripe pattern in the display region 31 which is exposed through the slits 25*k*, and exposure regions 34*h* are formed in a lattice pattern in the frame region 32 which is exposed through the dots 29.

The first substrate 1 is also exposed twice (the 1st shot and the 2nd shot), thereby exposing the vertical alignment film 5*a*, similarly to the second substrate 2. As shown in FIGS. 21(*a*) and 22(*a*), the direction of radiating UV light to the first substrate 1 is perpendicular to that to the second substrate 2 both in the display region 31 and the frame region 32 when the first substrate 1 and the second substrate 2 are attached to each other.

As a result of the 1st and 2nd exposure, each picture element in the display region 31 is divided into four domains 28*i*, 28*j*, 28*k*, and 28*l*, as shown in FIG. 21(*a*), similarly to Embodiment 2. Also, each picture element in the frame region 32 is divided into four domains 28*m*, 28*n*, 28*o*, and 28*p*, as shown in FIG. 22(*a*). More specifically, as shown in FIG. 21(*b*), when the right horizontal direction is defined as 0° as the display face is viewed in front, a central liquid crystal molecule 30*i* has a tilt angle of 225° in the domain 28*i*; a central liquid crystal molecule 30*j* has a tilt angle of 315° in the domain 28*j*; a central liquid crystal molecule 30*k* has a tilt angle of 45° in the domain 28*k*; and a central liquid crystal molecule 30*l* has a tilt angle of 135° in the domain 28*l*. Thus, the central liquid crystal molecules 30*i*, 30*j*, 30*k*, and 30*l* are tilted in a concentric pattern. As shown in FIG. 22(*b*), when the right horizontal direction is defined as 0° as the display face is viewed in front, a central liquid crystal molecule 30*m* has a tilt angle of 135° in the domain 28*m*; a central liquid crystal molecule 30*n* has a tilt angle of 315° in the domain 28*n*; a central liquid crystal molecule 30*o* has a tilt angle of 135° in the domain 28*o*; and a central liquid crystal molecule 30*p* has a tilt angle of 315° in the domain 28*p*. Thus, the central liquid crystal molecules 30*m*, 30*n*, 30*o*, and 30*p* are tilted parallel to each other.

The tilt direction of the molecule 30j in the domain 28j is the same as the tilt directions of the molecule 30n in the domain 28n and the molecule 30p in the domain 28p; the tilt direction of the molecule 30l in the domain 28l is the same as the tilt directions of the molecule 30m in the domain 28m and the molecule 30o in the domain 28o. However, the frame region 32 has no domain where the tilt direction of the central liquid crystal molecule is the same as the tilt directions of the molecule 30i in the domain 28i and the molecule 30k in the domain 28k in the display region 31. Thus, the combination of the domains 28a, 28b, 28c, and 28d in the display region 31 is different from that of the domains 28e, 28f, 26g, and 28h in the frame region 32.

A dark line 27i having a swastika shape appears at a boundary among the domains 28i, 28j, 28k, and 28l in the display region 31, as shown in FIG. 21(c), similarly to Embodiment 2. A dark line 27j having a lattice shape appears at a boundary among the domains 28m, 28n, 28o, and 28p in the frame region 32, as shown in FIG. 22(c). The width of the dark line 27j in the frame region 32 is larger than that of the dark line 27i in the display region 31. A region that is light-shielded by the dark line in the frame region 32 is larger than that in the display region 31.

Thus, according to the present Embodiment, the display region 31 and the frame region 32 are exposed through the two kinds of transmissive parts (the slits 25k and the dots 29) different in pattern. As a result, the combination of the domains in the display region 31 is advantageous to an aperture, and the combination of the domains in the frame region 32 is disadvantageous to an aperture. In contrast to the present Embodiment, in a conventional liquid crystal display device, the combination of domains is the same between the display region and the frame region, and so the combination of domains in the frame region is also advantageous to an aperture. Accordingly, according to the present Embodiment, an area of a region light-shielded by the dark lines in the frame region 32 is larger than that in the conventional liquid crystal display device and so the light leakage can be suppressed.

In the present Embodiment, the width and pitch of the dots 29 are preferably smaller than those of the slits 25k, respectively, although they may be appropriately determined. As a result, the light leakage from the frame region 32 can be more suppressed.

Embodiment 4

Embodiment 4 is mentioned below. The overlapping contents between the present Embodiment and Embodiments 1 to 3 are omitted and are not shown in drawings because a difference between the two is just an embodiment of the transmissive parts of the photomask through which the frame region is exposed. FIG. 23 is a schematic view showing an embodiment of exposure for an alignment film (a second substrate) in the exposure step (the 1st shot) in accordance with Embodiment 4. FIG. 23(a) is a plan view of a photomask. FIG. 23(b) is a plan view of the second substrate. FIG. 24 is a schematic view showing an embodiment of exposure for the alignment film (the second substrate) in the exposure step (the 2nd shot) in accordance with Embodiment 4. FIG. 24(a) is a plan view of the photomask. FIG. 24(b) is a plan view of the second substrate. FIG. 25 is an enlarged plan view schematically showing a region exposed by the 1st shot and the 2nd shot in a liquid crystal display panel in accordance with Embodiment 4. FIG. 25(a) shows a display region and FIG. 25(b) shows a flame region.

Exposure for a second substrate 2 is mentioned below. A photomask 20g in the present Embodiment has a mask part 21f (a first mask part) through which a display region 31 is exposed and a mask frame part 23c (a second mask part) through which a frame region 32 is exposed, as shown in FIG. 23(a). The mask part 21f has a plurality of slits 25l within a light-shielding region. The plurality of slits 25l each have a rectangular shape as viewed in plane. The slit 25l is arranged so that its longitudinal direction is in the lateral direction as the substrate is viewed in front. The width of the slit 25l is about quarter of a picture element pitch in the vertical direction when the second substrate 2 is viewed in front. The pitch of the slits 25l is about half the picture element pitch in the vertical direction when the second substrate 2 is viewed in front. The mask frame part 23c has a plurality of slits 25m within the light-shielding region. The plurality of slits 25m are arranged in an oblique direction and each have a parallelogram shape as viewed in plane. More specifically, the slit 25m is arranged so that its longitudinal direction makes an angle of 135° with respect to the right horizontal direction as the display face is viewed in front. A pitch 22 of the slits 25m is the same as a pitch P1 of the slits 25l in the same direction. So the width (length of the slit in the latitudinal direction) of the slit 25m is smaller than the width of the slit 25l. Thus, the photomask 20g has slits different in array direction between the mask part 21f and the mask frame part 23c. That is, the longitudinal direction of the slit 25m is different from that of the slit 25l.

Then, exposure procedures using the photomask 20g are mentioned. In the present Embodiment, the alignment film is exposed by shot exposure. More specifically, the second substrate 2 and the photomask 20f are arranged so that the mask part 21f overlaps with the display region 31 and the mask frame part 23c overlaps with the frame region 32. The position between the slits 25l and the picture elements in the second substrate 2 is adjusted, and then, similarly to Embodiment 2, a polarized UV light is radiated to the second substrate 2 from a direction oblique thereto, thereby exposing the vertical alignment film 5b (1st shot). More specifically, the vertical alignment film 5b is exposed from the longitudinal direction of the slit 25l. As a result of the 1st shot, exposure regions 34i are formed in a stripe pattern in the display region 31 which is exposed through the slits 25l, and exposure regions 34j are formed in a stripe pattern in the frame region 32 which is exposed through the slits 25m. The longitudinal direction of the exposure region 34i having a stripe pattern is different from that of the exposure region 34j having a stripe pattern by 45°.

Then, the photomask 20g is moved by a pitch of the slits 25l in the vertical direction as the second substrate 2 is viewed in front, as shown in FIG. 24(a). Then, the position between the photomask 20g and the second substrate 2 is adjusted so that each slit 25l is positioned in an unexposure region of each picture element. Then, (as the 2nd shot), the alignment film is exposed from a direction opposite to the UV light-irradiation direction in the 1st shot, for example, after changing a position of a light source. As a result of the 2nd shot, as shown in FIG. 24(b), exposure regions 34k are formed in a stripe pattern in the display region 31 which is exposed through the slits 25l, and exposure regions 34l are formed in a stripe pattern in the frame region 32 which is exposed through the slits 25m. In the display region 31, the exposure regions 34i and 34k, which are formed in a stripe pattern, extend in the lateral direction as the second substrate 2 is viewed in front, as shown in FIG. 25(a). In the frame region 32, the exposure regions 34j and 34l, which are formed in a stripe pattern, extend in the oblique direction as the second substrate 2 is viewed in front, as shown in FIG. 25(b). In a liquid crystal display panel including thus-exposed second substrate 2, a plurality of dark lines appear in the lateral direction at a boundary, which corresponds to the boundary between the slits 25*l* in the photomask 20*g*, between the exposure regions 34*i* and 34*k* in the display region 31, and a plurality of dark lines appear in an oblique direction at a boundary, which corresponds to the boundary between the slits 25*m* in the photomask 20*g*, between the exposure regions 34*j* and 34*l* in the frame region 32, when an image is displayed in an intermediate or higher gradation level on a display screen and the image is viewed in front. The distance between the dark lines appearing between the exposure regions 34*j* and 34*l* is smaller than the distance between the dark lines appearing between the exposure regions 34*i* and 34*k*. In FIGS. 25(*a*) and 25(*b*), the h1 and h2 show a shift amount of the photomask 20*g*, i.e., a moving distance from the position in the 1st shot to the position in the 2nd shot. The h1 and h2 are the same.

Thus, the display region 31 and the frame region 32 are exposed through the two kinds of slits 25*l* and 25*m* different in array direction by 45°. As a result, the distance between the dark lines appearing between the exposure regions 34*j* and 34*l* in the frame region 32 can be smaller than that between the dark lines appearing between the exposure regions 34*i* and 34*k* in the display region 31. Thus, according to the present Embodiment, the shape of the domains is different between the display region 31 and the frame region 32, and thereby the shape of the domains in the frame region 32 is advantageous to suppress the light leakage. In contrast to the present Embodiment, in a conventional liquid crystal display device, the shape of domains is the same between the display region and the frame region, and so the distance between dark lines appearing between exposure regions in the display region is the same as that in the frame region. Accordingly, according to the present Embodiment, an area of a region light-shielded by the dark lines in the frame region 32 is larger than that in the conventional liquid crystal display device and so the light leakage can be suppressed.

According to the present Embodiment, the angle made by the longitudinal direction of the slit 25*l* and that of the slit 25*m* is not necessarily 45° and may be appropriately determined.

In the present Embodiment, the pitch of the slits 25*m* are preferably smaller than that of the slits 25*l*, although it may be appropriately determined. As a result, the light leakage from the frame region 32 can be more suppressed.

Thus, the present invention is mentioned in detail with reference to Embodiments. In the liquid crystal display device of the present invention, the dark lines may appear in a region where no drawing wirings are arranged of the frame region, when an image is displayed in an intermediate or higher gradation level on the display screen and the image is viewed in front. As a result, light leakage from the region where no drawing wirings are arranged of the frame region can be more effectively suppressed.

Within the scope of the invention, the above-mentioned Embodiments may be appropriately combined.

The present application claims priority to Patent Application No. 2007-111823 filed in Japan on Apr. 20, 2007 under the Paris Convention and provisions of national law in a designated State, the entire contents of which are hereby incorporated by reference.

BRIEF DESCRIPTION OF DRAWINGS

FIG. 3(*a*) shows the first substrate. FIG. 3(*b*) shows the second substrate. In FIG. 3, the dotted arrow shows a direction of photo-irradiation to the first substrate, and the solid arrow shows a direction of photo-irradiation to the second substrate.

In FIG. 4, the dotted arrow shows a direction of photo-irradiation to the first substrate and the solid arrow shows a direction of photo-irradiation to the second substrate. FIG. 4 shows a liquid crystal molecule that is positioned at substantially the center in the thickness direction of the liquid crystal layer and in each domain when the substrates are viewed in plane.

FIG. 5(*b*) is a plan view schematically showing the second substrate (CF substrate) in accordance with Embodiment 1.

FIG. 6(*a*) is a plan view. FIG. 6(*b*) is a side view. In FIG. 6(*b*), the black arrow shows an irradiation direction of a polarized UV light (photo-irradiation direction) and the white arrow shows a moving direction of the first substrate.

FIG. 8(*a*) is a plan view. FIG. 8(*b*) is a side view. In FIG. 8(*b*), the black arrow shows an irradiation direction of a polarized UV light (photo-irradiation direction), and the white arrow shows a moving direction of the first substrate.

An upper part of FIG. 9 is a front view schematically showing an embodiment of a photomask, specifically, a part that is used for exposing a display region in the first substrate in the exposure step (the 1st and 2nd scan) in accordance with Embodiment 1. A lower part of FIG. 9 is a front view schematically showing picture elements in the first substrate where the alignment film is exposed through the photomask shown in the upper part.

Figure 1:
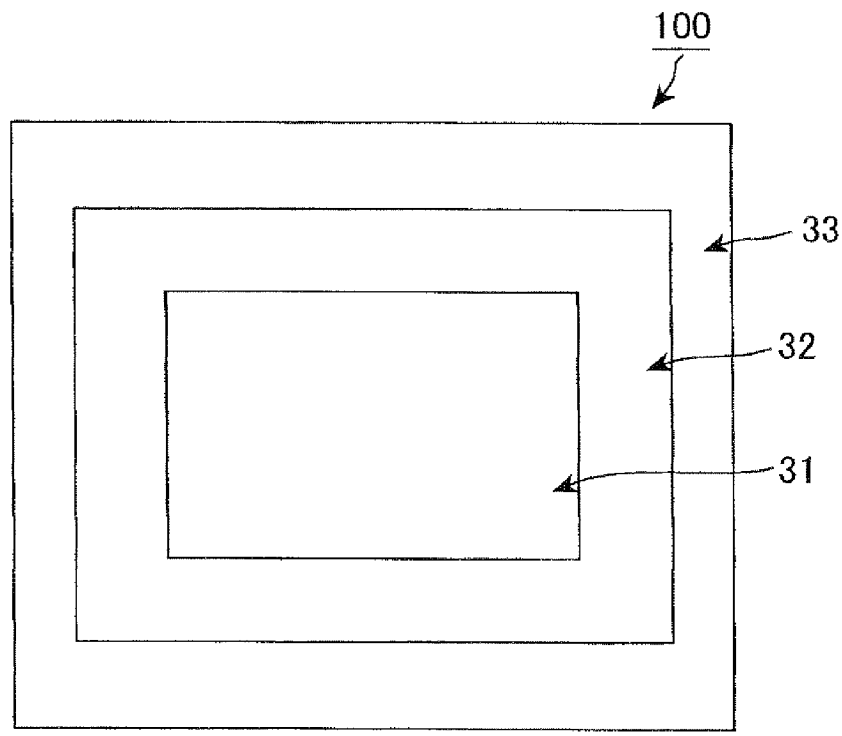
FIG. 1 is a plan view schematically showing a liquid crystal display panel in accordance with Embodiment 1.
Figure 2:
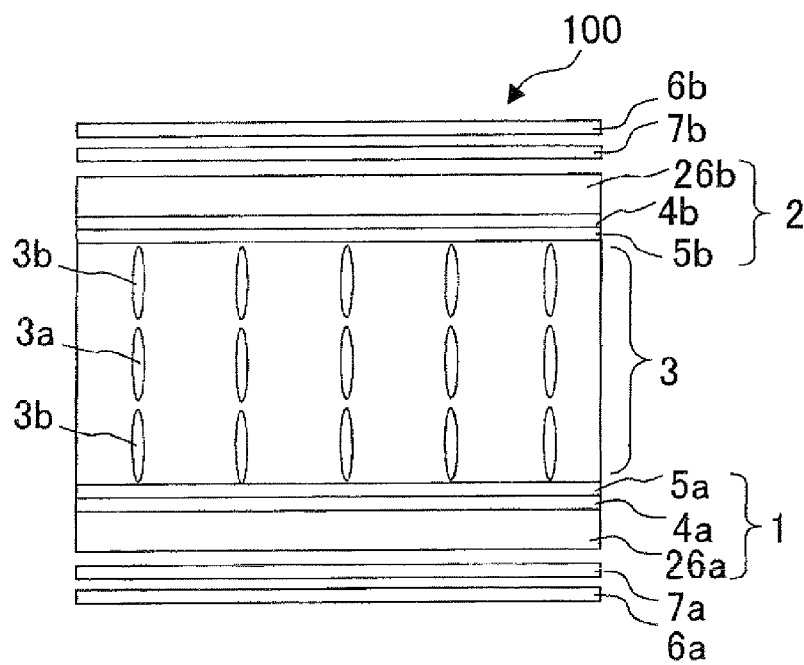
FIG. 2 is a cross-sectional view schematically showing a configuration of the display region in the liquid crystal display panel in accordance with Embodiment 1.
Figure 3:
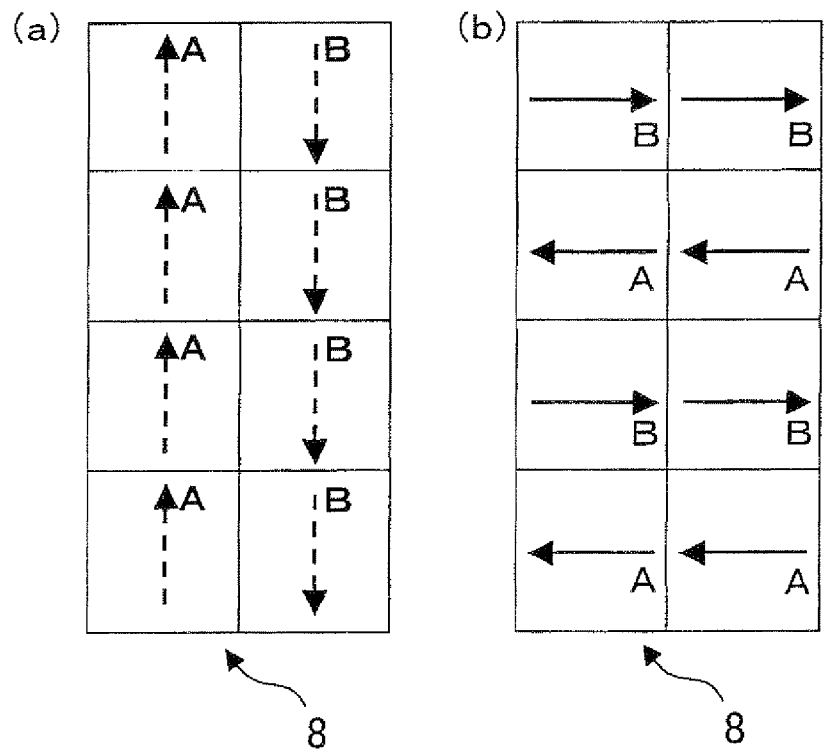
FIG. 3 is a plan view schematically showing a direction of photo-irradiation to the vertical alignment film in each picture element in the liquid crystal display panel in accordance with Embodiment 1.
Figure 4:
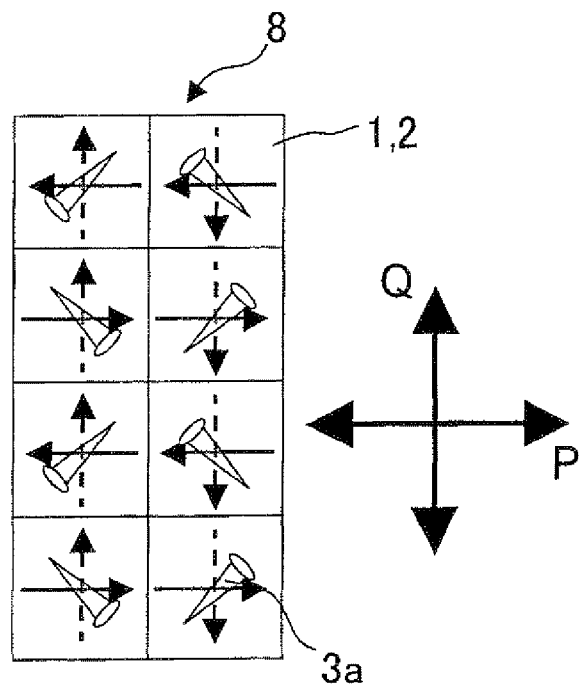
FIG. 4 is a plan view schematically showing: a direction of photo-irradiation to the vertical alignment film; an alignment direction of a liquid crystal molecule when a voltage is applied; and a direction of a polarization axis of a polarization plate and in each picture element in the liquid crystal display panel in accordance with Embodiment 1.
Figure 5:
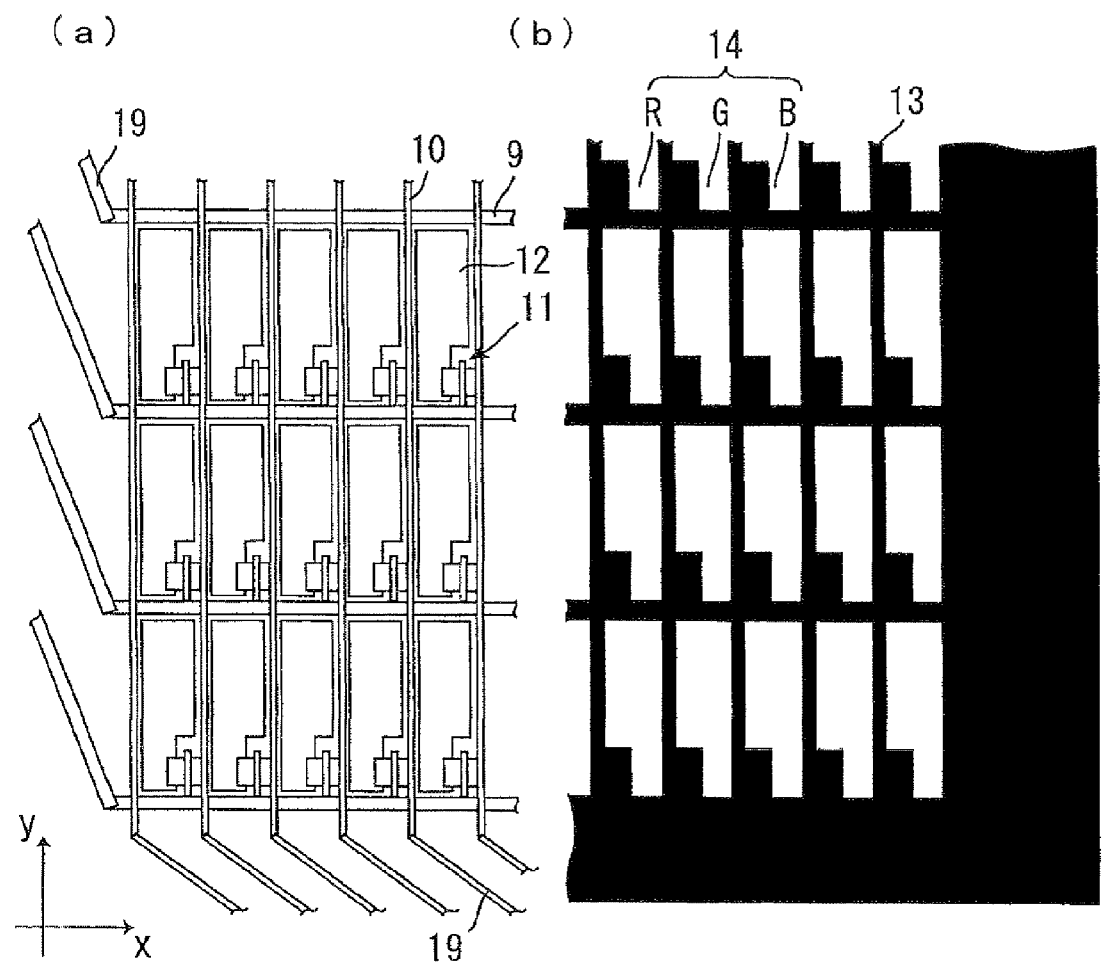
FIG. 5(*a*) is a plan view schematically showing the first substrate (TFT array substrate) in accordance with Embodiment 1.
Figure 6:
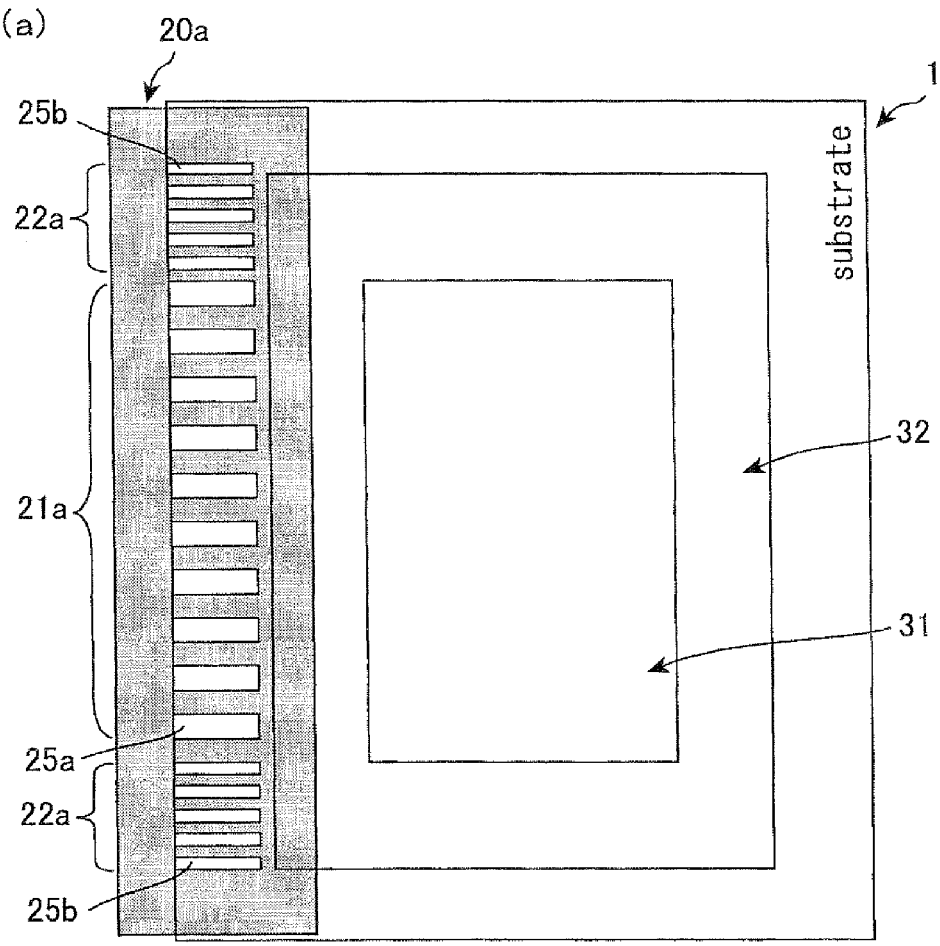
FIG. 6 is a schematic view showing an embodiment of scanning exposure for an alignment film (substrate) in the exposure step (the 1st scan) in accordance with Embodiment 1.
Figure 6:
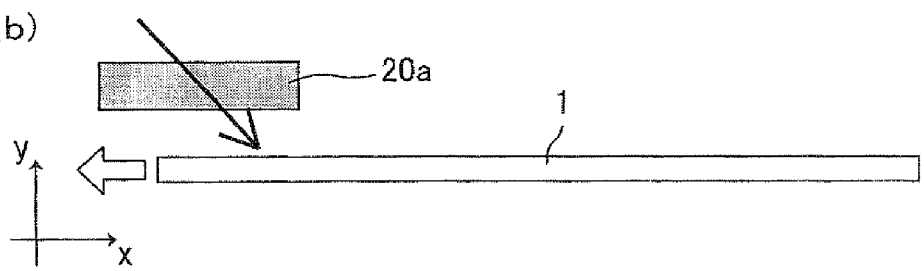
Figure 7:
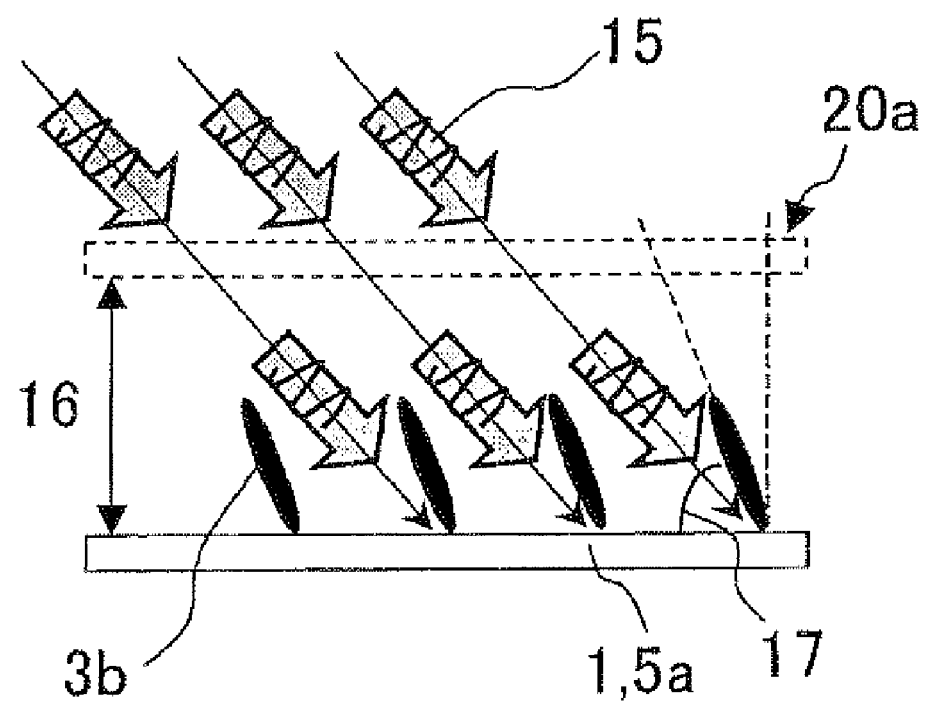
FIG. 7 is a cross-sectional view schematically showing an embodiment of photo-irradiation to the alignment film (substrate) in the exposure step in accordance with Embodiment 1.
Figure 8:
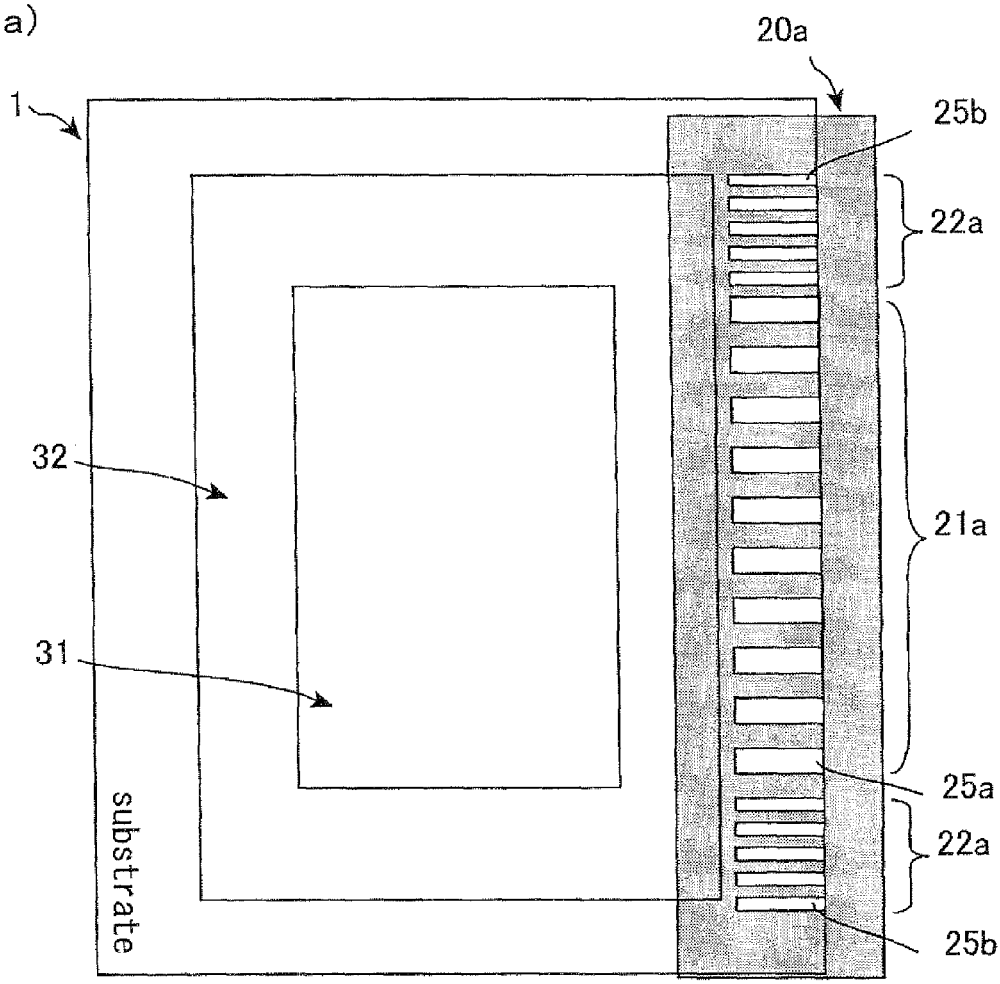
FIG. 8 is a schematic view showing an embodiment of scanning exposure for an alignment film (substrate) in the exposure step (the 2nd scan) in accordance with Embodiment 1.
Figure 8:
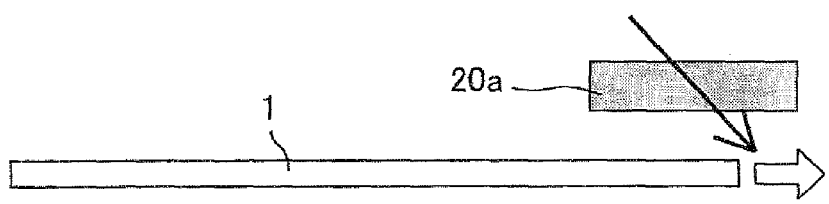
Figure 9:
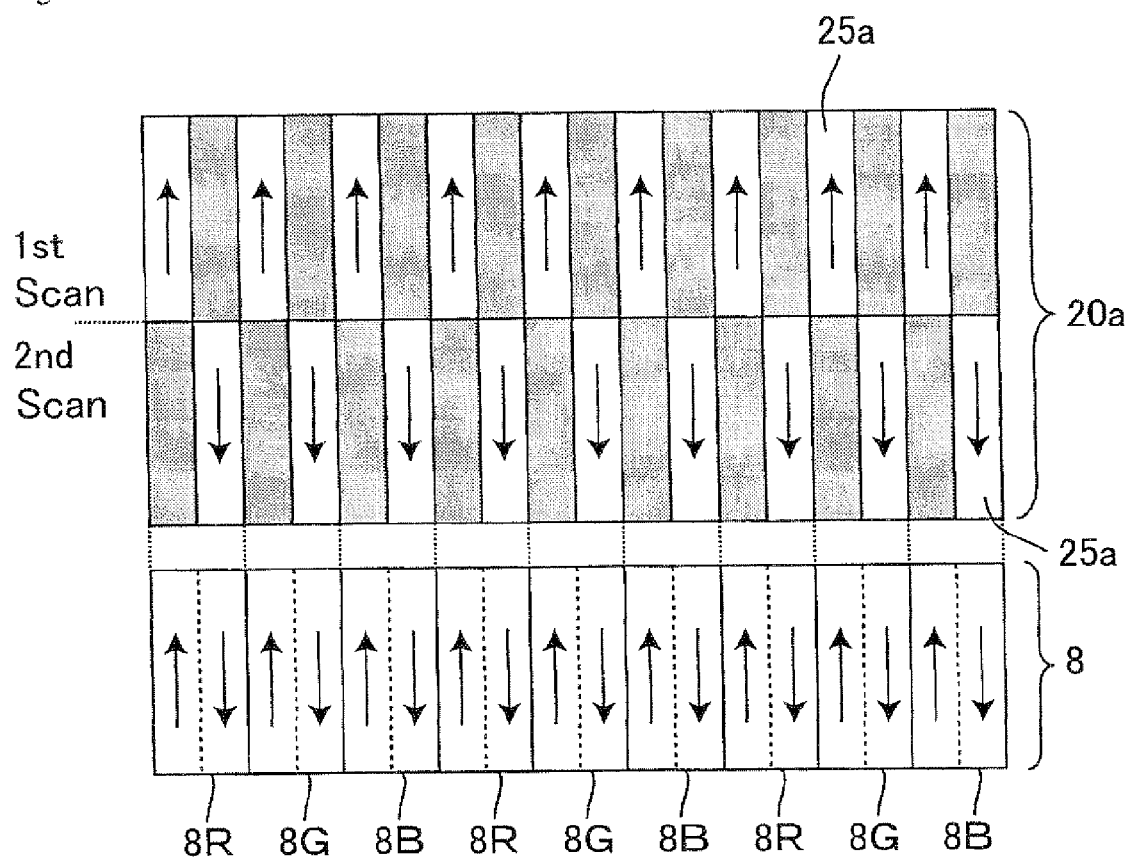
In FIG. 9, the black arrow shows a photo-irradiation direction.
Figure 10:
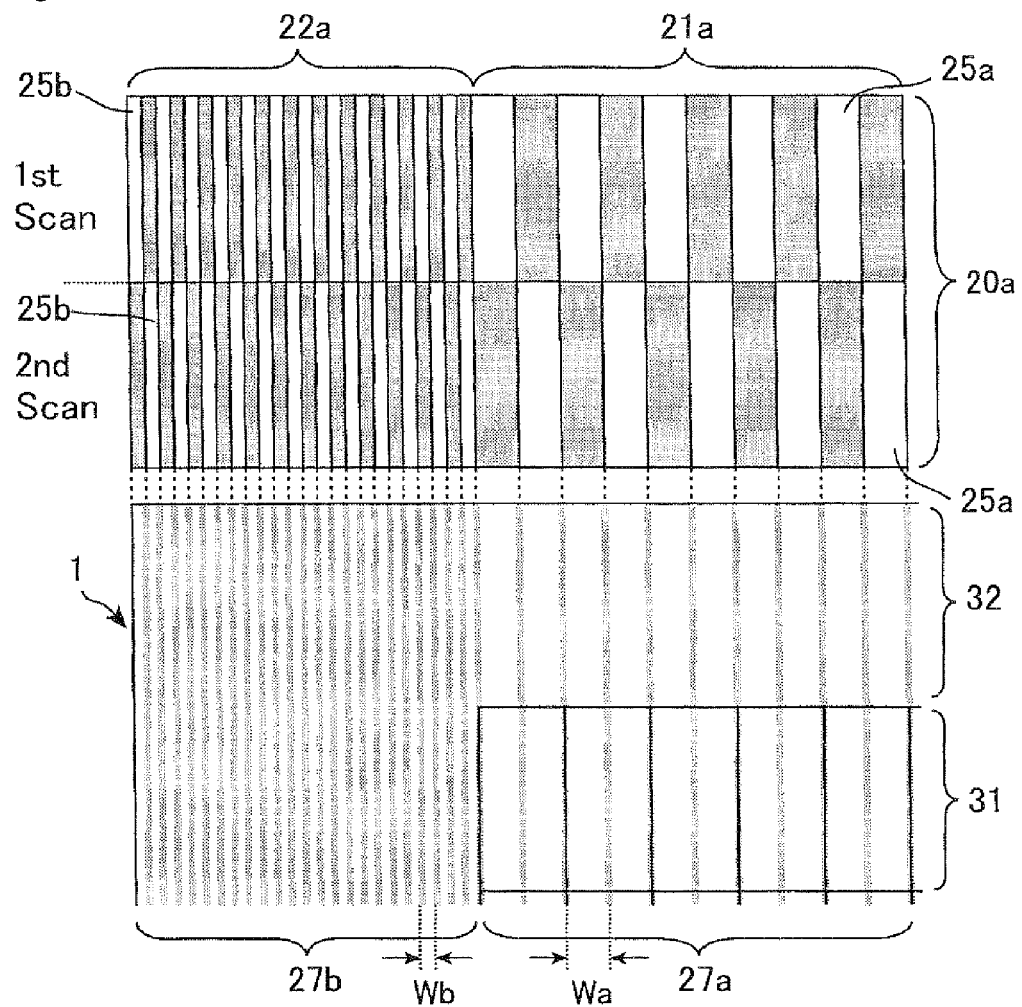

An upper part of FIG. 10 is a front view schematically showing an embodiment of a photomask, specifically, parts that are used for exposing a display region and a frame region in the first substrate in the exposure step (the 1st and 2nd scan) in accordance with Embodiment 1. A lower part of FIG. 10 is a front view schematically showing a display region near a corner of the first substrate where the alignment film is exposed through the photomask shown in the upper part. This lower part also shows dark lines (gray lines) that can appear in the case that the alignment film is exposed through this photomask.

Figure 11:
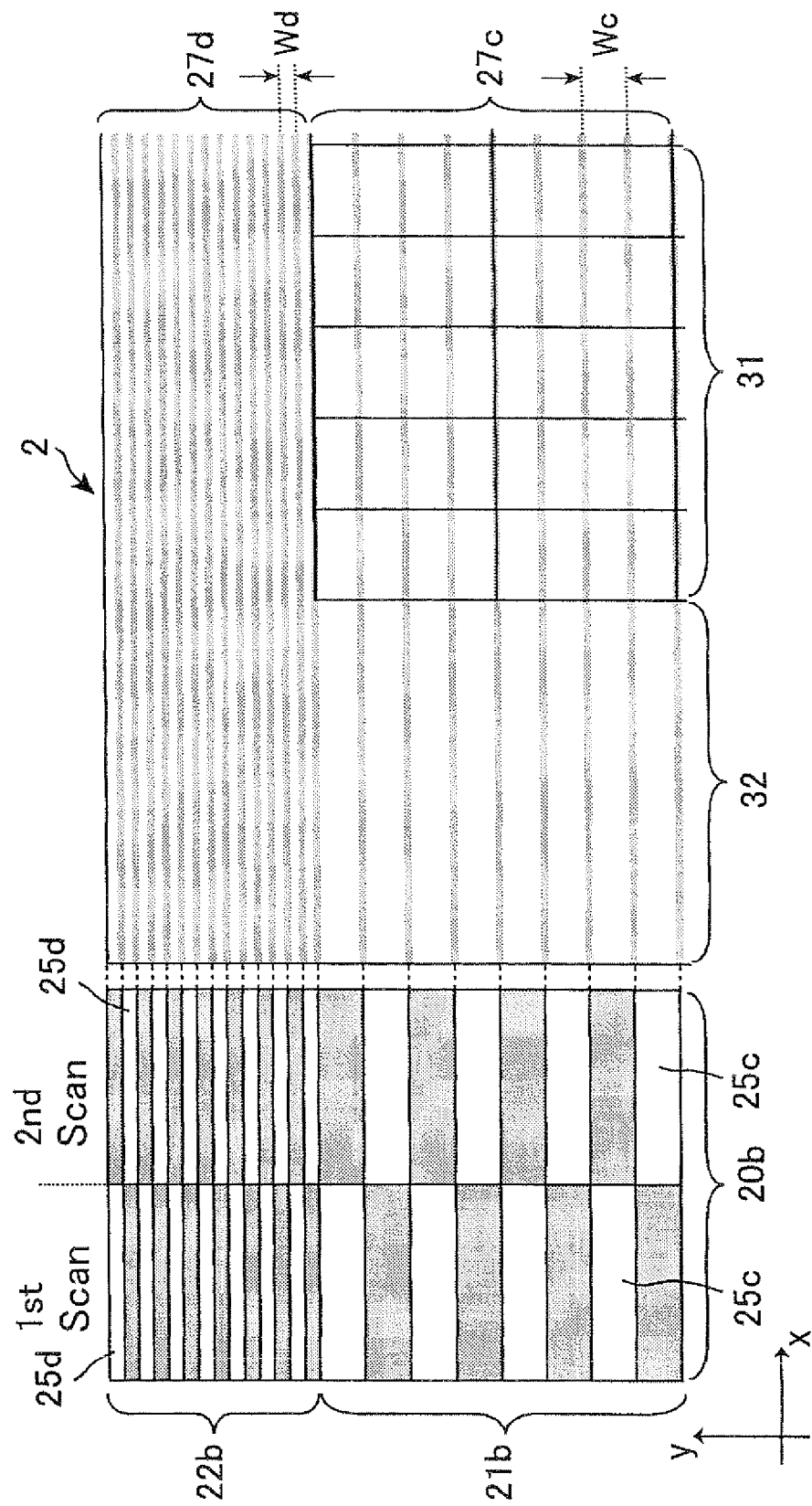

A left part of FIG. 11 is a front view schematically showing an embodiment of a photomask, specifically, parts that are used for exposing a display region and a frame region in the second substrate in the exposure step (the 1st and 2nd scan) in accordance with Embodiment 1. A right part of FIG. 11 is a front view schematically showing a display region near a corner of the second substrate where the alignment film is exposed through the photomask shown in the upper part. The right part also shows dark lines (gray lines) that can appear when the alignment film is exposed through this photomask.

Figure 12:
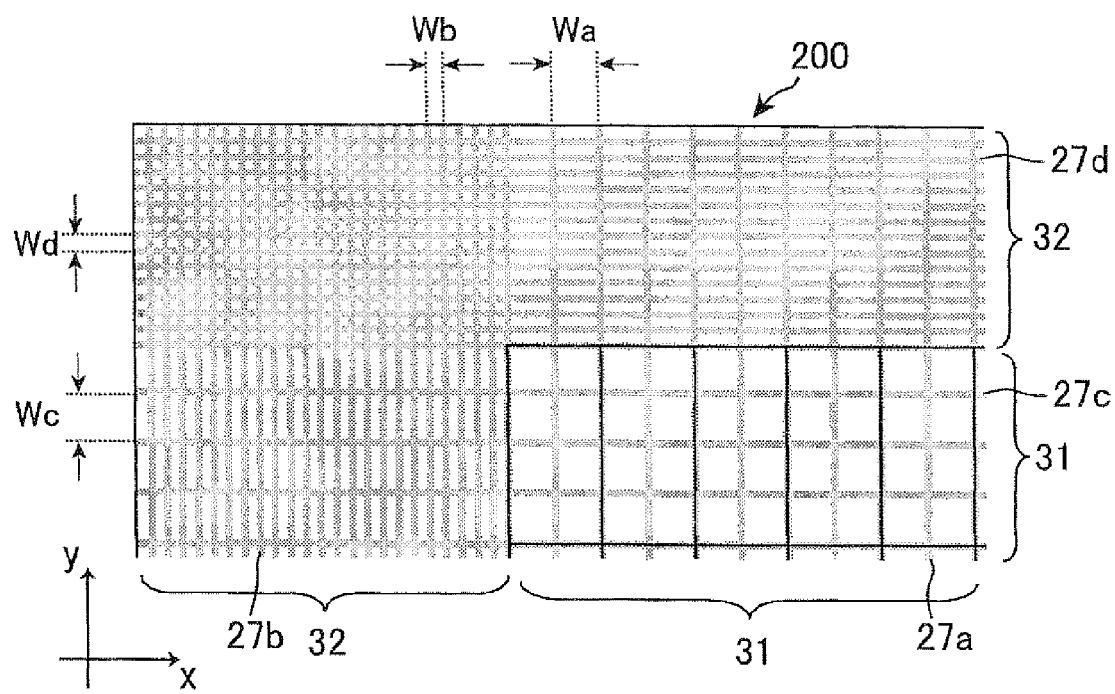

FIG. 12 is a front view schematically showing a display region near a corner in the liquid crystal display device in accordance with Embodiment 1 when an image is displayed in an intermediate or higher gradation level.

Figure 13:
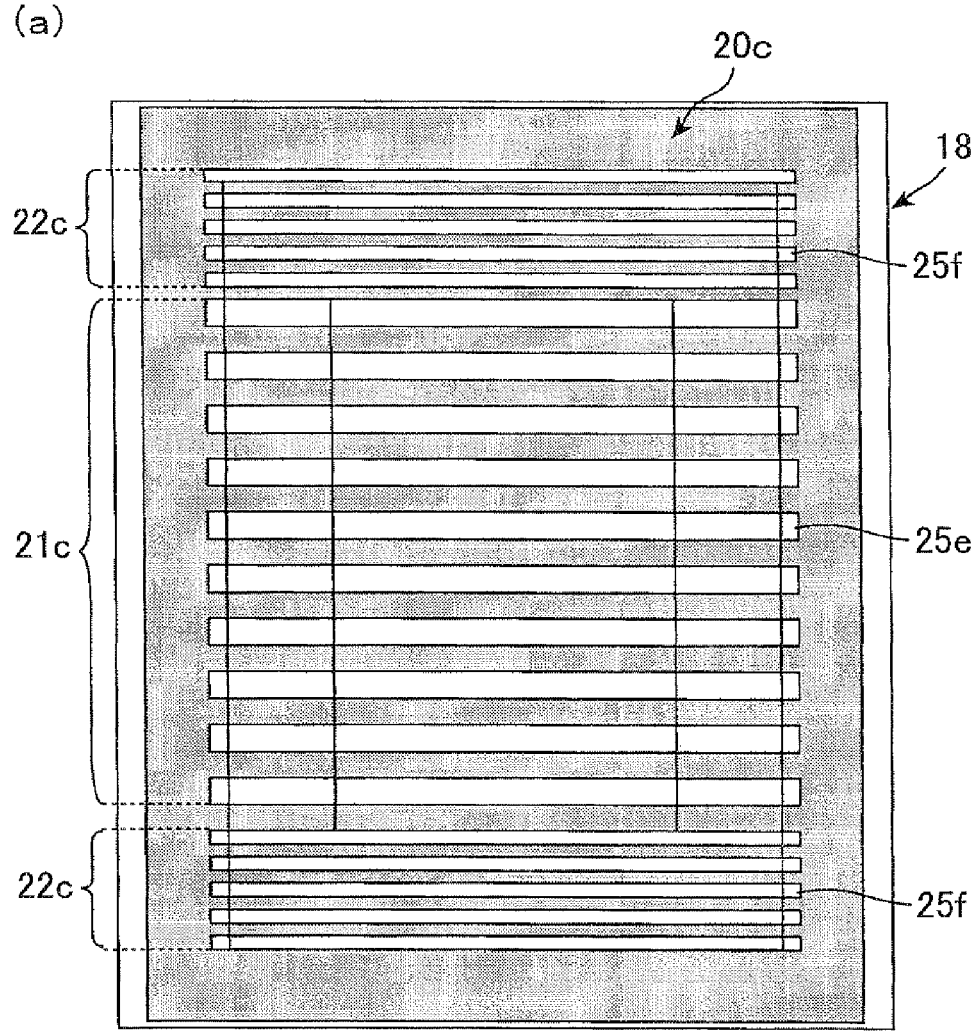
Figure 13:
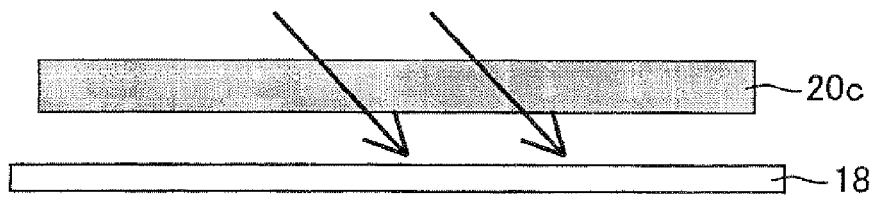

FIG. 13 is a schematic view showing an embodiment of shot exposure for an alignment film (substrate) in the exposure step in accordance with Embodiment 1. FIG. 13(a) is a plan view. FIG. 13(b) is a side view. In FIG. 13(b), the black arrow shows an irradiation direction of a polarized UV light (photo-irradiation direction).

Figure 14:
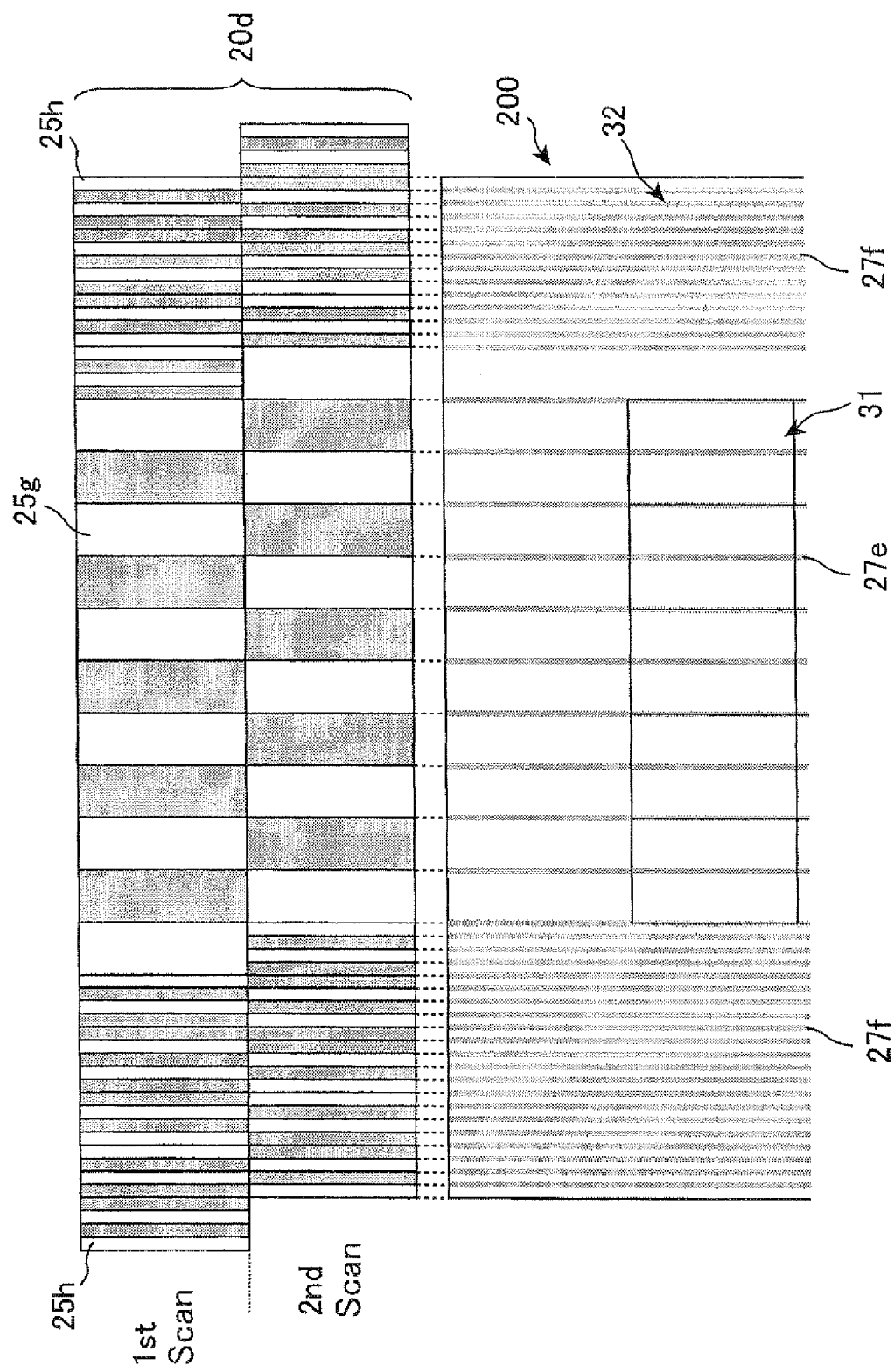

An upper part of FIG. 14 is a front view schematically showing another embodiment of a photomask, specifically, parts that are used for exposing a display region and a frame region of a substrate in the exposure step in accordance with Embodiment 1. A lower part of FIG. 14 is a front view schematically showing a display region near a corner of the substrate where the alignment film is exposed through the photomask shown in the upper part. The lower part also shows dark lines (gray lines) that can appear when the alignment film is exposed in this photomask.

Figure 15:
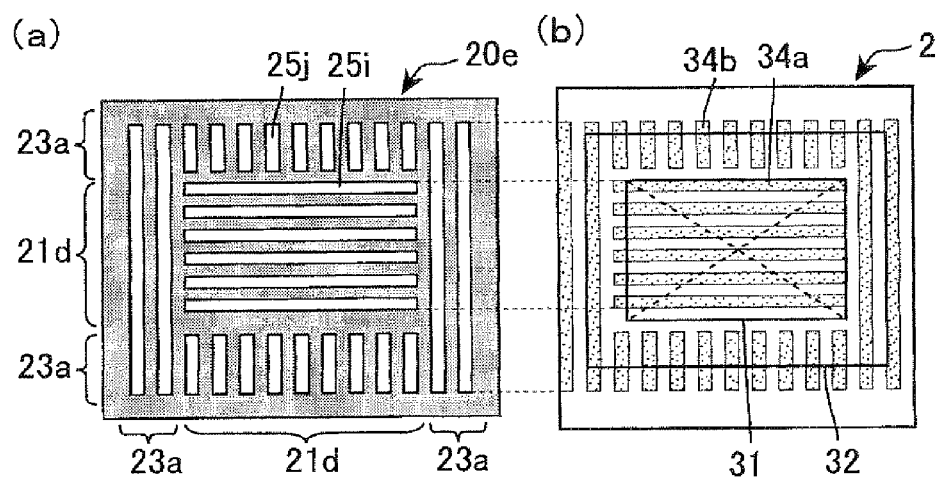

FIG. 15 is a schematic view showing an embodiment of exposure for an alignment film (a second substrate) in the exposure step (the 1st scan) in accordance with Embodiment 2. FIG. 15(a) is a plan view of a photomask. FIG. 15(b) is a plan view of the second substrate.

Figure 16:
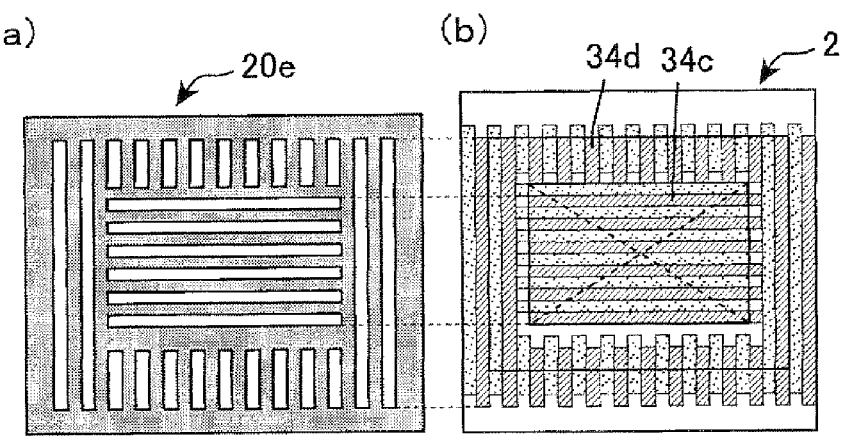

FIG. 16 is a schematic view showing an embodiment of exposure for the alignment film (the second substrate) in the exposure step (the 2nd scan) in accordance with Embodiment 2. FIG. 16(a) is a plan view of the photomask. FIG. 16(b) is a plan view of the second substrate.

Figure 17:
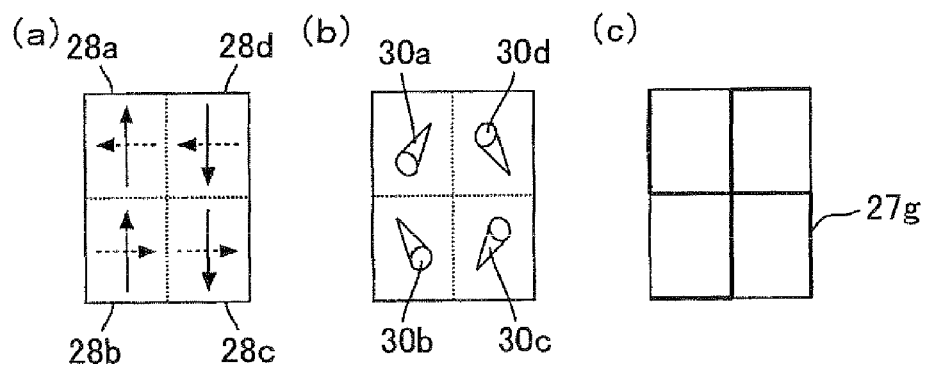

FIG. 17 is a plan view schematically showing one picture element in a display region of a liquid crystal display panel in accordance with Embodiment 2. FIG. 17(a) shows a direction of photo-irradiation to a vertical alignment film. FIG. 17(b) shows an alignment direction of a liquid crystal molecule when a voltage is applied. FIG. 17(c) shows a dark line appearing when an image is displayed in an intermediate or higher gradation level. In FIG. 17(a), the solid arrow shows a direction of photo-irradiation to a first substrate, and the dot arrow shows a direction of photo-irradiation to the second substrate. FIG. 17(b) shows a liquid crystal molecule that is positioned at substantially the center in the thickness direction of the liquid crystal layer and in each domain when the substrate is viewed in plane.

Figure 18:
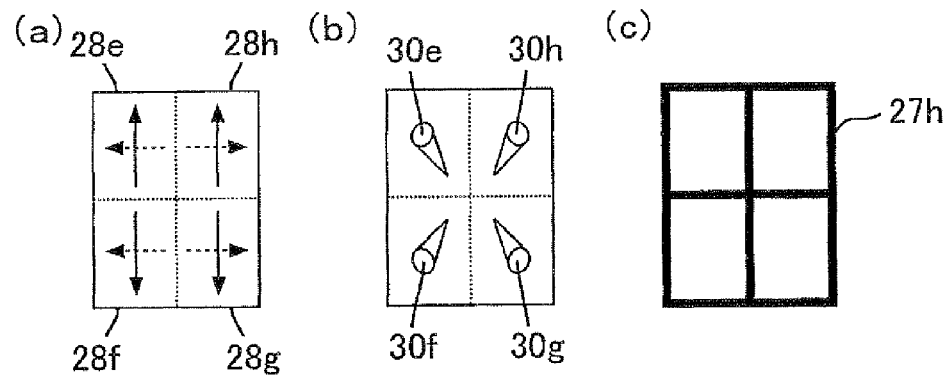

FIG. 18 is a plan view schematically showing one picture element in a frame region of the liquid crystal display panel in accordance with Embodiment 2. FIG. 18(a) shows a direction of photo-irradiation to a vertical alignment film. FIG. 18(b) shows an alignment direction of a liquid crystal molecule when a voltage is applied. FIG. 18(c) shows a dark line appearing when an image is displayed in an intermediate or higher gradation level. In FIG. 18(a), the solid arrow shows a direction of photo-irradiation to the first substrate, and the dot arrow shows a direction of photo-irradiation to the second substrate. FIG. 18(b) shows a liquid crystal molecule that is positioned at substantially the center in the thickness direction of the liquid crystal layer and in each domain when the substrate is viewed in plane.

Figure 19:
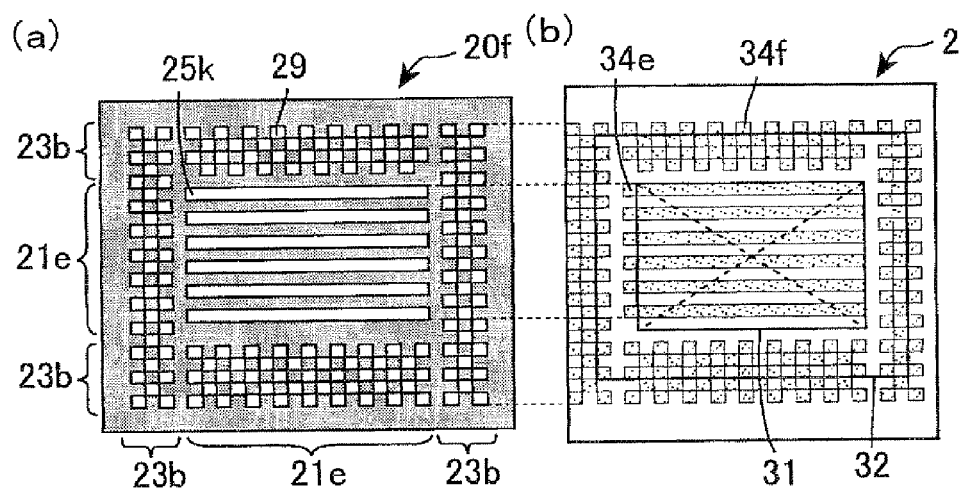

FIG. 19 is a schematic view showing an embodiment of exposure for an alignment film (a second substrate) in the exposure step (the 1st scan) in accordance with Embodiment 3. FIG. 19(a) is a plan view of a photomask. FIG. 19(b) is a plan view of the second substrate.

Figure 20:
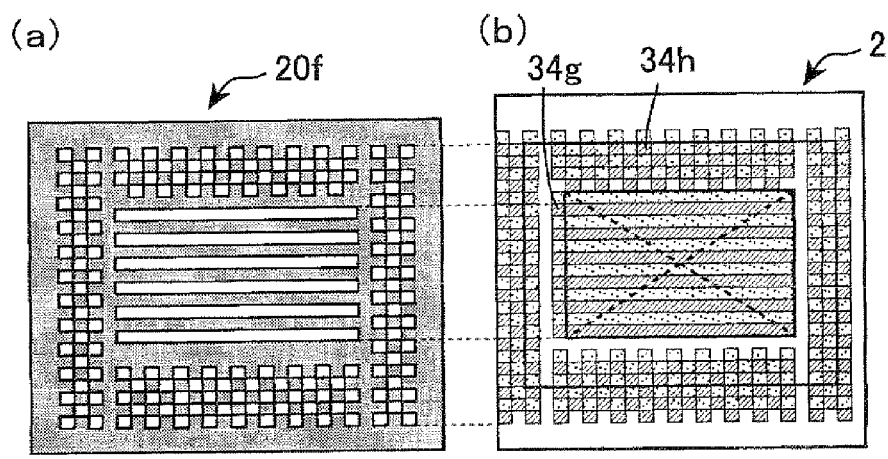

FIG. 20 is a schematic view showing an embodiment of exposure for the alignment film (the second substrate) in the exposure step (the 2nd scan) in accordance with Embodiment 3. FIG. 20(a) is a plan view of the photomask. FIG. 20(b) is a plan view of the second substrate.

Figure 21:
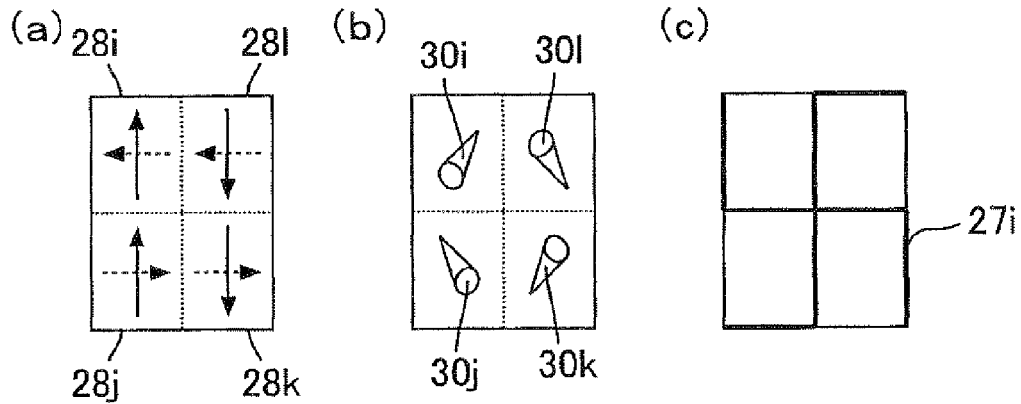

FIG. 21 is a plan view schematically showing one picture element in a display region of a liquid crystal display panel in accordance with Embodiment 3. FIG. 21(a) shows a direction of photo-irradiation to a vertical alignment film. FIG. 21(b) shows an alignment direction of a liquid crystal molecule when a voltage is applied. FIG. 21(c) shows a dark line appearing when an image is displayed in an intermediate or higher gradation level. In FIG. 21(a), the solid arrow shows a direction of photo-irradiation to a first substrate, and the dot arrow shows a direction of photo-irradiation to the second substrate. FIG. 21(b) shows a liquid crystal molecule that is positioned at substantially the center in the thickness direction of the liquid crystal layer and in each domain when the substrate is viewed in plane.

Figure 22:
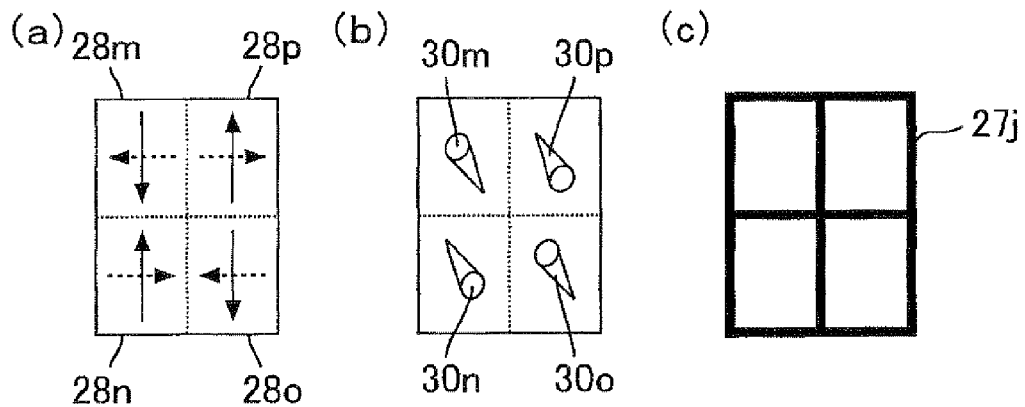

FIG. 22 is a plan view schematically showing one picture element in a frame region of the liquid crystal display panel in accordance with Embodiment 3. FIG. 22(a) shows a direction of photo-irradiation to a vertical alignment film. FIG. 22(b) shows an alignment direction of a liquid crystal molecule when a voltage is applied. FIG. 22(c) shows a dark line appearing when an image is displayed in an intermediate or higher gradation level. In FIG. 22(a), the solid arrow shows a direction of photo-irradiation to the first substrate, and the dot arrow shows a direction of photo-irradiation to the second substrate. FIG. 22(b) shows a liquid crystal molecule that is positioned at substantially the center in the thickness direction of the liquid crystal layer and in each domain when the substrate is viewed in plane.

Figure 23:
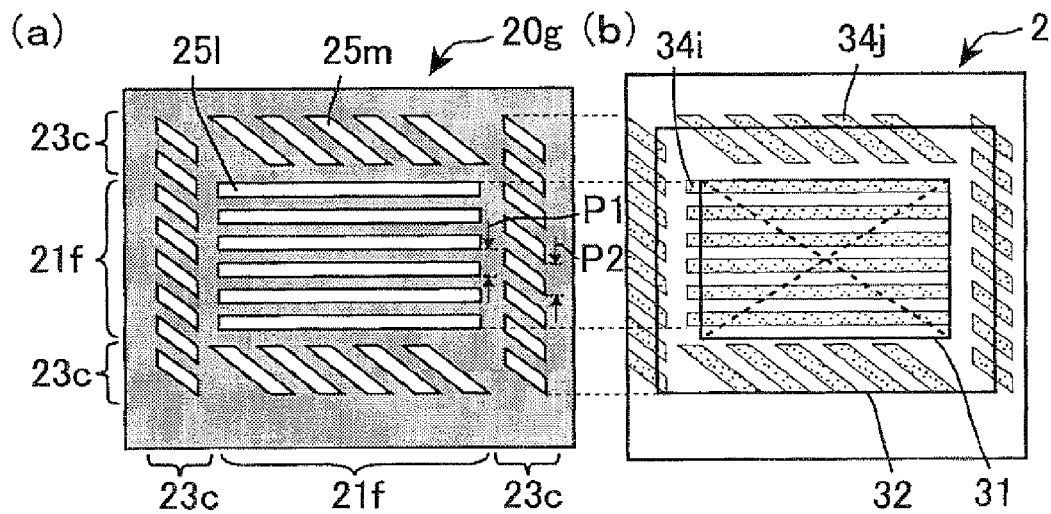

FIG. 23 is a schematic view showing an embodiment of exposure for an alignment film (a second substrate) in the exposure step (the 1st scan) in accordance with Embodiment 4. FIG. 23(a) is a plan view of a photomask. FIG. 23(b) is a plan view of the second substrate.

Figure 24:
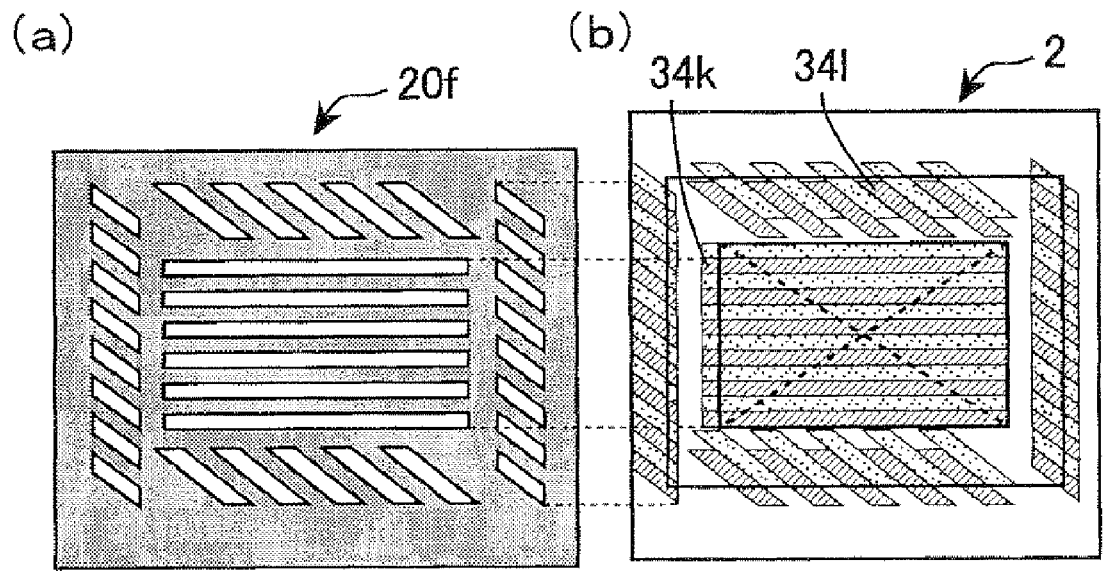

FIG. 24 is a schematic view showing an embodiment of exposure for the alignment film (the second substrate) in the exposure step (the 2nd scan) in accordance with Embodiment 4. FIG. 24(a) is a plan view of the photomask. FIG. 24(b) is a plan view of the second substrate.

Figure 25:
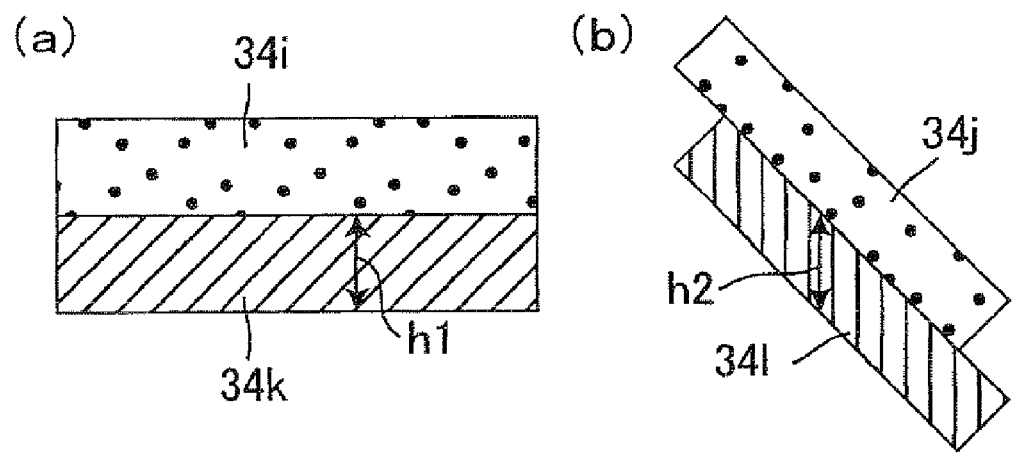

FIG. 25 is an enlarged plan view schematically showing a region exposed by the 1st shot and the 2nd shot in a liquid crystal display panel in accordance with Embodiment 4, FIG. 25(a) shows a display region. FIG. 25(b) shows a frame region.

EXPLANATION OF NUMERALS AND SYMBOLS

1: First Substrate
2: Second Substrate
3: Liquid crystal layer
3a, 3b: Liquid crystal molecule
4a, 4b: Transparent electrode
5a, 5b: Vertical alignment film
6a, 6b: Polarization plate
7a, 7b: Retarder
8: Picture element
9: Scanning signal line
10: Data signal line
11: TFT
12: Pixel electrode
13: Black matrix (BM)
14: Color filter 15: Light beam (Polarized UV light)
16: Proximity gap
17: Pretilt angle
18: Substrate
19: Drawing wiring
20a, 20b, 20c, 20d, 20e, 20f, 20g: Photomask
21a, 21b, 21c, 21d, 21e, 21f: Mask part
22a, 22b, 22c: Mask fine part
23a, 23b, 23c: Mask frame part
25a, 25b, 25c, 25d, 25e, 25f, 25g, 25h, 25i, 25j, 25k, 25l, 25m: Slit
26a, 26b: Insulating substrate
27a, 27b, 27c, 27d, 27e, 27f, 27g, 27h, 27i, 27j: Dark line
28a, 28b, 28c, 28d, 28e, 28f, 28g, 28h, 28i, 28j, 28k, 28l, 28m, 28n, 28o, 28p: Domain
29: Dot
30a, 30b, 30c, 30d, 30e, 30f, 30g, 30h, 30i, 30j, 30k, 30l, 30m, 30n, 30o, 30p: Central liquid crystal molecule
31: Display region
32: Frame region
33: Terminal region
34a, 34b, 34c, 34d, 34e, 34f, 34g, 34h, 34i, 34j, 34k, 34l: Exposure region
100: Liquid crystal display panel
200: Liquid crystal display device
P: Direction of polarization axis of polarization plate 6a
Q: Direction of polarization axis of polarization plate 6b
A, B: Direction
R: Red colored layer
G: Blue colored layer
B: Green colored layer
Wa, Wb, Wc, Wd: Pitch of dark line (distance between dark lines)
P1, P2: Pitch of slit (distance between slits)
h1, h2: Shift amount (moving distance) of photomask

The invention claimed is:

1. A liquid crystal display device comprising:
a pair of substrates facing each other;
a liquid crystal layer arranged between the pair of substrates;
an alignment film arranged on a liquid crystal layer-side surface of at least one of the pair of substrates; and
a pixel including two or more domains,
wherein the liquid crystal display device has a display region and a frame region,
when an image is displayed in an intermediate or higher gradation level on a display screen and the image is viewed in front,
in the display region, a plurality of first dark lines appear in a first direction between adjacent domains at a constant pitch, and
the frame region includes a region where a plurality of second dark lines appear in a direction parallel to the first direction at a pitch different from the constant pitch.

2. The liquid crystal display device according to claim 1, wherein the pitch of the plurality of second dark lines is smaller than the constant pitch.

3. The liquid crystal display device according to claim 2, wherein in the display region, a plurality of third dark lines further appear in a second direction between adjacent domains at a constant pitch,
the second direction being perpendicular to the first direction, and
in the region included in the frame region, a plurality of fourth dark lines further appear in a direction parallel to the second direction at a pitch smaller than the constant pitch of the plurality of third dark lines.

4. A liquid crystal display device comprising:
a pair of substrates facing each other;
a liquid crystal layer arranged between the pair of substrates;
an alignment film arranged on a liquid crystal layer-side surface of at least one of the pair of substrates; and
a pixel including two or more domains,
wherein the liquid crystal display device has a display region and a frame region each having a plurality of domains,
in the display region and the frame region, dark lines appear between adjacent domains when an image is displayed in an intermediate or higher gradation level on a display screen and the image is viewed in front, and
an arrangement of the plurality of domains in the frame region is different from an arrangement of the plurality of domains in the display region.

5. A liquid crystal display device comprising:
a pair of substrates facing each other;
a liquid crystal layer arranged between the pair of substrates;
an alignment film arranged on a liquid crystal layer-side surface of at least one of the pair of substrates; and
a pixel including two or more domains,
wherein the liquid crystal display device has a display region and a frame region each having a plurality of domains,
in the display region and the frame region, dark lines appear between adjacent domains when an image is displayed in an intermediate or higher gradation level on a display screen and the image is viewed in front, and
a combination of the plurality of domains in the frame region is different from a combination of the plurality of domains in the display region.

6. A liquid crystal display device comprising:
a pair of substrates facing each other;
a liquid crystal layer arranged between the pair of substrates;
an alignment film arranged on a liquid crystal layer-side surface of at least one of the pair of substrates; and
a pixel including two or more domains,
wherein the liquid crystal display device has a display region and a frame region each having a plurality of domains,
in the display region and the frame region, dark lines appear between adjacent domains when an image is displayed in an intermediate or higher gradation level on a display screen and the image is viewed in front, and
a shape of the plurality of domains in the frame region is different from a shape of the plurality of domains in the display region.

7. The liquid crystal display device according to claim 1, wherein the pixel includes four or less domains.

8. The liquid crystal display device according to claim 1, wherein the liquid crystal layer includes liquid crystal molecules with negative dielectric anisotropy,
the alignment film is arranged on each of the pair of substrates, and
the alignment films align the liquid crystal molecules nearly vertically to surfaces of the alignment films when no voltage is applied to the liquid crystal layer.

9. The liquid crystal display device according to claim 8, wherein an alignment direction of the liquid crystal molecules near a surface of the alignment film on one of the pair of substrates is perpendicular to an alignment direction of the liquid crystal molecules near a surface of the alignment film on the other substrate when the pair of substrates are viewed in plane.

10. The liquid crystal display device according to claim 1, wherein the liquid crystal layer includes liquid crystal molecules with positive dielectric anisotropy, the alignment film is arranged on each of the pair of substrates, and the alignment films align the liquid crystal molecules nearly horizontally to surfaces of the alignment films when no voltage is applied to the liquid crystal layer.

11. The liquid crystal display device according to claim 10, wherein an alignment direction of the liquid crystal molecules near a surface of the alignment film on one of the pair of substrates is perpendicular to an alignment direction of the liquid crystal molecules near a surface of the alignment film on the other substrate when the pair of substrates are viewed in plane.

\* \* \* \* \*